US012342621B2

(12) United States Patent
Wang et al.

(10) Patent No.: US 12,342,621 B2
(45) Date of Patent: Jun. 24, 2025

(54) ARRAY PANEL, AND DISPLAY DEVICE HAVING TOUCH SIGNAL LINE, COMMON ELECTRODE AND PIXEL ELECTRODE SEQUENTIALLY STACKED AND OVERLAPPING SUB-PIXEL OPENING AREA

(71) Applicants: BEIJING BOE DISPLAY TECHNOLOGY CO., LTD., Beijing (CN); BOE Technology Group Co., Ltd., Beijing (CN)

(72) Inventors: Xiao Wang, Beijing (CN); Xu Wang, Beijing (CN); Yu Ma, Beijing (CN); Yan Yan, Beijing (CN)

(73) Assignees: BEIJING BOE DISPLAY TECHNOLOGY CO., LTD., Beijing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/775,392

(22) PCT Filed: May 28, 2021

(86) PCT No.: PCT/CN2021/096724
§ 371 (c)(1),
(2) Date: May 9, 2022

(87) PCT Pub. No.: WO2022/246794
PCT Pub. Date: Dec. 1, 2022

(65) Prior Publication Data
US 2024/0162244 A1 May 16, 2024

(51) Int. Cl.
*H10D 86/60* (2025.01)
*G02F 1/1362* (2006.01)
(Continued)

(52) U.S. Cl.
CPC ....... *H10D 86/60* (2025.01); *G02F 1/136286* (2013.01); *G06F 3/04164* (2019.05); *H10D 86/443* (2025.01)

(58) Field of Classification Search
CPC ........... H01L 27/1244; G02F 1/136286; G02F 1/134372; G02F 1/13338; G06F 3/04164;
(Continued)

(56) References Cited

U.S. PATENT DOCUMENTS

2017/0148819 A1* 5/2017 Lin ................... G02F 1/133345
2018/0052349 A1 2/2018 Chen
(Continued)

FOREIGN PATENT DOCUMENTS

| CN | 105094442 A | 11/2015 |
| CN | 105870130 A | 8/2016 |

(Continued)

*Primary Examiner* — Davienne N Monbleau
*Assistant Examiner* — John Patrick Cornely
(74) *Attorney, Agent, or Firm* — Intellectual Valley Law, P.C.

(57) ABSTRACT

An array substrate includes: a substrate; a sub-pixel, wherein the sub-pixel is located on the substrate, and the sub-pixel includes a pixel electrode and a common electrode, an orthographic projection of the pixel electrode on the substrate at least partially overlap an orthographic projection of an opening area of the sub-pixel on the substrate, and an orthographic projection of the common electrode on the substrate at least partially overlaps the orthographic projection of the opening area of the sub-pixel on the substrate; and a touch signal line, wherein the touch signal line is located on the substrate, and an orthographic projection of the touch signal line on the substrate partially overlaps the orthographic projection of the opening area of the sub-pixel on the
(Continued)

substrate; the touch signal line, the common electrode and the pixel electrode are stacked in sequence along a direction away from the substrate.

16 Claims, 16 Drawing Sheets

(51) Int. Cl.
  *G06F 3/041* (2006.01)
  *H10D 86/40* (2025.01)

(58) Field of Classification Search
  CPC ... G06F 3/04184; G06F 3/0412; H10D 86/80; H10D 86/443
  See application file for complete search history.

(56) References Cited

U.S. PATENT DOCUMENTS

| | | | |
|---|---|---|---|
| 2021/0011570 | A1 | 1/2021 | Luo et al. |
| 2021/0011571 | A1* | 1/2021 | Zhang .................... G06F 3/044 |
| 2021/0018781 | A1 | 1/2021 | Chen et al. |

FOREIGN PATENT DOCUMENTS

| | | | |
|---|---|---|---|
| CN | 106773227 A | 5/2017 | |
| CN | 108182010 A | 6/2018 | |
| CN | 109061914 A | 12/2018 | |
| CN | 109388265 A | 2/2019 | |
| CN | 109582179 A | 4/2019 | |
| CN | 209373313 U | 9/2019 | |
| CN | 110442255 A | 11/2019 | |
| CN | 212255943 U | 12/2020 | |
| WO | WO-2019029167 A1 * | 2/2019 | ......... G02F 1/13338 |

* cited by examiner

ARRAY PANEL, AND DISPLAY DEVICE HAVING TOUCH SIGNAL LINE, COMMON ELECTRODE AND PIXEL ELECTRODE SEQUENTIALLY STACKED AND OVERLAPPING SUB-PIXEL OPENING AREA

CROSS-REFERENCE TO RELATED APPLICATION

This application is a national stage application under 35 U.S.C. § 371 of International Application No. PCT/CN2021/096724, filed May 28, 2021, the contents of which are incorporated by reference in the entirety.

TECHNICAL FIELD

The present disclosure relates to the field of display technology, and more particularly to an array panel, a method of manufacturing the same and a display device.

BACKGROUND

With the continuous development of display technology, liquid crystal display panels have been widely used in display devices such as notebook computers and televisions. The liquid crystal display panel mainly includes an array substrate and an opposite substrate arranged oppositely, and a liquid crystal layer arranged between the array substrate and the opposite substrate. When the liquid crystal display panel is in operation, a driving electric field is generated between the array substrate and the opposite substrate, the liquid crystal molecules in the liquid crystal layer are deflected under the driving action of the driving electric field, thereby realizing the display function of the liquid crystal display panel.

SUMMARY

The objective of the present disclosure is to provide an array panel, a method of manufacturing the same, and a display device.

In order to achieve the above objective, the following technical solutions are provided by the present disclosure.

In a first aspect, an array panel includes: a substrate; a sub-pixel, wherein the sub-pixel is located on the substrate, and the sub-pixel includes a pixel electrode and a common electrode, an orthographic projection of the pixel electrode on the substrate at least partially overlap an orthographic projection of an opening area of the sub-pixel on the substrate, and an orthographic projection of the common electrode on the substrate at least partially overlaps the orthographic projection of the opening area of the sub-pixel on the substrate; and a touch signal line, wherein the touch signal line is located on the substrate, and an orthographic projection of the touch signal line on the substrate partially overlaps the orthographic projection of the opening area of the sub-pixel on the substrate; the touch signal line, the common electrode and the pixel electrode are stacked in sequence along a direction away from the substrate.

Optionally, the touch signal line includes a first portion, and an orthographic projection of the first portion on the substrate overlaps the orthographic projection of the opening area of the sub-pixel on the substrate, the orthographic projection of the first portion of the touch signal line on the substrate at least partially overlaps the orthographic projection of the common electrode on the substrate.

Optionally, the orthographic projection of the first portion of the touch signal line on the substrate is completely covered by the orthographic projection of the common electrode on the substrate.

Optionally, the array substrate further includes: an organic insulating layer, at least part of the organic insulating layer being located between the touch signal line and the common electrode.

Optionally, the array substrate further includes: a function electrode, wherein the function electrode includes a first sub-function electrode portion and a second sub-function electrode portion, at least part of the first sub-function electrode portion and at least part of the second sub-function electrode portion are both extended along a first direction, the first sub-function electrode portion is located on a first side of the opening area of the sub-pixel, the second sub-function electrode portion is located on a second side of the opening area of the sub-pixel, and the first side and the second side are opposite along a second direction, the second direction intersects the first direction.

Optionally, the function electrode further includes a third sub-function electrode portion, at least part of the third sub-function electrode portion extends along the second direction, and the third sub-function electrode portion is respectively electrically connected to the first sub-function electrode portion and the common electrode.

Optionally, the array substrate further includes: a first insulating layer, wherein the third sub-function electrode portion, the first insulating layer, the organic insulating layer and the common electrode are stacked in sequence along the direction away from the substrate; the common electrode is coupled to the third sub-function electrode portion through a first connection hole, and the first connection hole penetrates the organic insulating layer and the first insulating layer.

Optionally, the sub-pixel further comprises: a driving circuit, wherein at least part of an output electrode of the driving circuit is located between the first insulating layer and the organic insulating layer; the array substrate further includes a passivation layer, at least part of the passivation layer is located between the common electrode and the pixel electrode; the pixel electrode is coupled to the output electrode through a second connection hole and a third connection hole, the second connection hole penetrates the organic insulating layer and the first insulating layer, the third connection hole penetrates the passivation layer, an orthographic projection of the second connection hole on the substrate surrounds an orthographic projection of the third connection hole on the substrate, an orthographic projection of a boundary of the second connection hole on the substrate at least partially overlaps an orthographic projection of the output electrode on the substrate.

Optionally, the array substrate further includes: a plurality of gate lines, a plurality of data lines and a plurality of sub-pixels; wherein the plurality of gate lines and the plurality of data lines cross to each other to form a plurality of sub-pixel areas, and a plurality of opening areas included in the plurality of sub-pixels are located in the plurality of sub-pixel areas in a one-to-one corresponding manner; the plurality of sub-pixels includes a plurality of sub-pixel columns, and each sub-pixel column includes a plurality of sub-pixels arranged along the first direction; a touch electrode layer arranged in a touch area of the array substrate, wherein the touch area includes a plurality of touch sub-areas, the touch electrode layer includes a plurality of touch electrode units, and the plurality of touch electrode units are located in the plurality of touch sub-areas in a one-to-one corresponding manner; and, a plurality of touch signal lines coupled to the plurality of touch electrode units in a one-to-one corresponding manner, wherein the touch signal lines correspond to target sub-pixel columns in the plurality of sub-pixel columns in a one-to-one manner, and an orthographic projection of the touch signal line on the substrate partially overlaps an orthographic projection of an opening area of each sub-pixel in a corresponding target sub-pixel column on the substrate.

Optionally, a plurality of common electrodes located in a same touch sub-area are coupled to each other, and the plurality of common electrodes are multiplexed as touch electrode units in the touch sub-area.

Optionally, the array substrate further includes: a plurality of function electrodes corresponding to the plurality of sub-pixels in a one-to-one manner, wherein the touch signal line is coupled to a second sub-function electrode portion corresponding to at least part of target sub-pixels included in the target sub-pixel column corresponding to the touch signal line, and target sub-pixels included in the target sub-pixel column corresponding to the touch signal line are located in the touch sub-area corresponding to the touch signal line.

Optionally, the target sub-pixel includes a connection pattern, the connection pattern and the pixel electrode are arranged at a same layer and made of a same material, and the connection pattern is respectively coupled to the second sub-function electrode portion corresponding to the target sub-pixel and the corresponding touch signal line.

Optionally, the connection pattern is coupled to the corresponding touch signal line through a fourth connection hole and a fifth connection hole, and the fourth connection hole penetrates the organic insulating layer and the first insulating layer, the fifth connection hole penetrates the passivation layer, an orthographic projection of the fourth connection hole on the substrate surrounds an orthographic projection of the fifth connection hole on the substrate, an orthographic projection of a boundary of the fourth connection hole on the substrate at least partially overlaps an orthographic projection of the corresponding touch signal line on the substrate.

Optionally, the connection pattern is coupled to the corresponding second sub-function electrode portion through the fourth connection hole and the fifth connection hole.

Optionally, the touch signal line is coupled to a second sub-function electrode portions corresponding to each sub-pixel in the target sub-pixel column corresponding to the touch signal line.

Optionally, the array substrate further includes a first conductive connection portion and a second conductive connection portion, wherein among function electrodes corresponding to each target sub-pixel, the third sub-function electrode portion is coupled to the second sub-function electrode portion through the first conductive connection portion; among function electrodes corresponding to sub-pixels located in a same touch sub-area, third sub-function electrode portions adjacent in the second direction are coupled through the second conductive connection portion.

Optionally, the third sub-function electrode portion is electrically connected to the second sub-function electrode portion; the array substrate further includes: a third conductive connection portion, the third conductive connection portion is coupled to two third sub-function electrode portions that are adjacent to each other along the second direction and located in the same touch sub-area.

Optionally, the pixel electrode has a plurality of slits, and at least part of the plurality of slits extend along the first direction.

Optionally, the orthographic projection of the touch signal line on the substrate partially overlaps an orthographic projection of a slit included in each pixel electrode in the corresponding target sub-pixel column on the substrate.

Optionally, an orthographic projection of the first sub-function electrode portion on the substrate, an orthographic projection of the second sub-function electrode portion on the substrate, and an orthographic projection of the third sub-function electrode portion on the substrate are all located at a periphery of the orthographic projection of the pixel electrode in the corresponding sub-pixel on the substrate.

Optionally, the plurality of sub-pixels includes a plurality of sub-pixel rows, and each sub-pixel row includes a plurality of sub-pixels arranged along the second direction; the gate lines correspond to the plurality of sub-pixel rows in a one-to-one manner; an orthographic projection of the first sub-function electrode portion on the substrate, an orthographic projection of the second sub-function electrode portion on the substrate, an orthographic projection of the third sub-function electrode portion on the substrate, and an orthographic projection of a corresponding gate line on the substrate together surrounds the opening area of the corresponding sub-pixel.

Optionally, the first sub-function electrode portion, the second sub-function electrode portion, and the third sub-function electrode portion are arranged at a same layer and made of a same material as the gate line.

Optionally, an orthographic projection of the first sub-function electrode portion on the substrate partially overlaps an orthographic projection of a data line located on a first side of the opening area of the corresponding sub-pixel on the substrate; and/or, an orthographic projection of the second sub-function electrode portion on the substrate partially overlaps an orthographic projection of a data line located on a second side of the opening area of the corresponding sub-pixel on the substrate.

Optionally, an orthographic projection of the first sub-function electrode portion on the substrate is located between the orthographic projection of the opening area of the corresponding sub-pixel on the substrate and an orthographic projection of a data line located on a first side of the opening area of the sub-pixel on the substrate; and/or, an orthographic projection of the second sub-function electrode portion on the substrate is located between the orthographic projection of the opening area of the corresponding sub-pixel on the substrate and an orthographic projection of a data line located on a second side of the opening area of the sub-pixel on the substrate.

Optionally, there is an overlapping area between the orthographic projection of the touch signal line on the substrate and the orthographic projection of the opening area of one sub-pixel on the substrate, and a ratio d of the overlapping area to an area of the orthographic projection of the opening area of the sub-pixel on the substrate satisfies: $4\% \leq d \leq 10\%$.

Optionally, a distance L1 between the orthographic projection of the first connection hole on the substrate and the orthographic projection of the touch signal line on the substrate satisfies: $5\ \mu m \leq L1 \leq 90\ \mu m$; a distance L2 between the orthographic projection of the touch signal line on the substrate and an orthographic projection of a data line close to the second sub-function electrode portion on the substrate satisfies: $8\ \mu m \leq L2 \leq 30\ \mu m$; a distance L3 between the orthographic projection of the first connection hole on the substrate and an orthographic projection of a data line close to the first sub-function electrode portion on the substrate satisfies: 5 µm≤L3≤30 µm.

Optionally, a width L4 of the touch signal line in a direction perpendicular to an extension direction of the touch signal line satisfies: 3.5 µm≤L4≤6 µm.

Optionally, a distance between the orthographic projection of the third connection hole on the substrate and an orthographic projection of a common electrode in the corresponding sub-pixel on the substrate is less than a distance between the orthographic projection of the fifth connection hole on the substrate and the orthographic projection of the common electrode on the substrate.

Optionally, an area of the non-overlapping area between the orthographic projection of the fourth connection hole on the substrate and the orthographic projection of the touch signal line on the substrate is greater than or equal to one third of an area of the orthographic projection of the fourth connection hole on the substrate; a part of the orthographic projection of the fourth connection hole on the substrate that does not overlap the orthographic projection of the touch signal line on the substrate is located in a side of the orthographic projection of the touch signal line on the substrate away from the orthographic projection of the second connection hole on the substrate.

Optionally, the orthographic projection of the first connection hole on the substrate and the orthographic projection of the second connection hole on the substrate are both located on a same side of the orthographic projection of the touch signal line on the substrate.

Optionally, a distance between the orthographic projection of the second connection hole on the substrate and the orthographic projection of a corresponding data line on the substrate is smaller than a distance between the orthographic projection of the first connection hole on the substrate and the orthographic projection of the data line on the substrate.

Based on the above solution of the array substrate, a second aspect of the present disclosure provides a display device including the array substrate.

Based on the above solution of the array substrate, a third aspect of the present disclosure provides a method of manufacturing an array substrate, includes: forming a sub-pixel and a touch signal line on a substrate; wherein the sub-pixel includes a pixel electrode and a common electrode, an orthographic projection of the pixel electrode on the substrate at least partially overlaps an orthographic projection of an opening area of the sub-pixel on the substrate, and an orthographic projection of the common electrode on the substrate at least partially overlaps the orthographic projection of the opening area of the sub-pixel on the substrate; an orthographic projection of the touch signal line on the substrate partially overlaps the orthographic projection of the opening area of the sub-pixel on the substrate; the touch signal line, the common electrode and the pixel electrode are stacked in sequence along a direction away from the substrate.

Optionally, the method further includes: forming a gate line, a first sub-function electrode portion, a second sub-function electrode portion and a third sub-function electrode portion on the substrate; wherein at least part of the first sub-function electrode portion and at least part of the second sub-function electrode portion extend along a first direction, the first sub-function electrode portion is located on a first side of the opening area of the sub-pixel, the second sub-function electrode portion is located on a second side of the opening area of the sub-pixel, the first side and the second side are opposite along a second direction, the second direction intersects the first direction; at least part of the third sub-function electrode portion extends along the second direction, the third sub-function electrode portion and the first sub-function electrode portion are coupled; forming a first insulating layer, the first insulating layer covering the gate line, the first sub-function electrode portion, the second sub-function electrode portion and the third sub-function electrode portion; forming an output electrode of the driving circuit, the data line and the touch signal line on a side of the first insulating layer away from the substrate; forming an organic insulating layer, the organic insulating layer covering the output electrode of the driving circuit, the data line and the touch signal line; forming a first connection hole, a second connection hole and a fourth connection hole in one patterning process; the first connection hole, the second connection hole and the fourth connection hole all penetrating the organic insulating layer and the first insulating layer; the first connection hole exposing at least part of the third sub-function electrode portion; the second connection hole exposing at least part of the corresponding output electrode, and an orthographic projection of a boundary of the second connection hole on the substrate at least partially overlapping the orthographic projection of the corresponding output electrode on the substrate; the fourth connection hole exposing at least part of the corresponding touch signal line and at least part of the second sub-function electrode portion, and an orthographic projection of a boundary of the fourth connection hole on the substrate at least partially overlapping the orthographic projection of the corresponding touch signal line on the substrate; forming a common electrode, the common electrode being coupled to the corresponding third sub-function electrode portion through the first connection hole; forming a passivation layer, the passivation layer covering the common electrode; patterning the passivation layer to form a third connection hole and a fifth connection hole; the third connection hole and the fifth connection hole both penetrating the passivation layer; the third connection hole exposing at least part of the corresponding output electrode, the orthographic projection of the second connection hole on the substrate surrounding the orthographic projection of the third connection hole on the substrate; the fifth connection hole exposing at least part of the corresponding touch signal line and at least part of the second sub-function electrode portion, the orthographic projection of the fourth connection hole on the substrate surrounding the orthographic projection of the fifth connection hole on the substrate; forming a pixel electrode and a connection pattern, wherein the pixel electrode is coupled to the output electrode through the second connection hole and the third connection hole, and the connection pattern is coupled to the corresponding touch signal line through the fourth connection hole and the fifth connection hole; the connection pattern is also coupled to the corresponding second sub-function electrode portion through the fourth connection hole and the fifth connection hole.

BRIEF DESCRIPTION OF THE DRAWINGS

The drawings described here are used to provide a further understanding of the present disclosure and constitute a portion of the present disclosure. The exemplary embodiments and descriptions of the present disclosure are used to explain the present disclosure, and do not constitute an improper limitation of the present disclosure.

DETAILED DESCRIPTION

Figure 1:
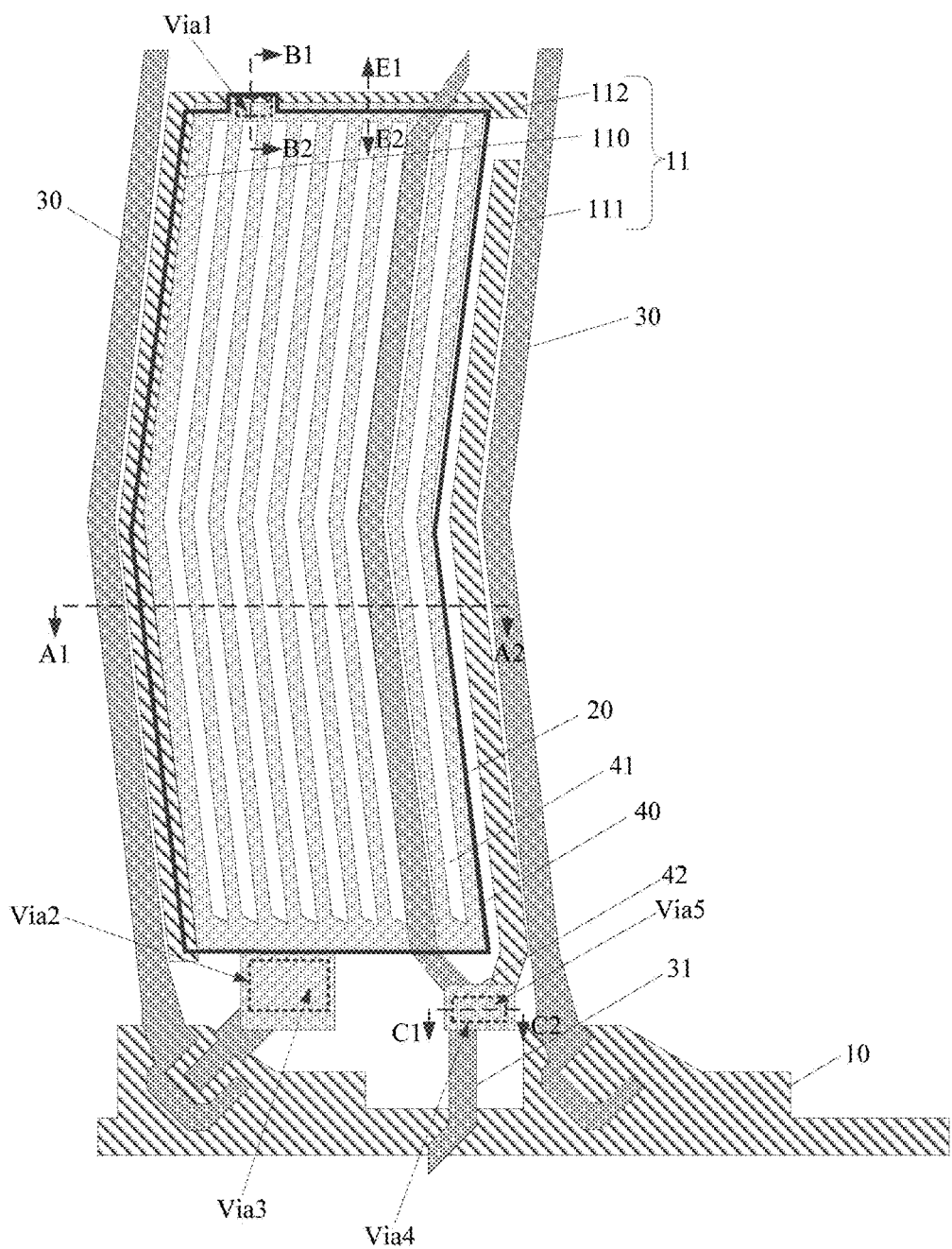
FIG. 1 is a schematic diagram of a first layout of a sub-pixel according to an embodiment of the present disclosure.

In order to further explain the array panel and the manufacturing method thereof and the display device provided by the embodiments of the present disclosure, a detailed description will be given below in conjunction with the accompanying drawings of the disclosure.

The present disclosure discloses an array substrate, which integrates a touch electrode layer and a touch signal line into the array substrate, so that when a liquid crystal display panel is fabricated by using the array substrate, the liquid crystal display panel can be used to integrate the touch electrode layer and the touch signal line for the touch function into the liquid crystal display panel, to realize the liquid crystal touch display panel in the Full In Cell Touch structure. The LCD touch display panel with Full In Cell Touch structure integrates touch function and display function, which not only can realize one-stop seamless production, but also has the advantages of integration, lightness, low cost, low power consumption, high image quality and multi-touch and others.

When both the touch electrode layer and the touch signal lines are integrated into the array substrate, the touch signal lines and the data lines in the array substrate are generally arranged side by side in a non-opening area between adjacent columns of sub-pixels, and since the touch signal line and the data line are arranged on the same layer and made of the same material, the distance between the data line and the touch signal line in the same non-opening area needs to be increased (currently, the distance between the data line and the touch signal line in the same non-opening is generally more than 6.5 um), to avoid the short circuit between the data line and the touch signal line, this method will reduce the aperture ratio of the LCD panel, which is not conducive to the improvement of the display quality of the LCD panel.

Based on the existence of the above problems, in the present disclosure, the touch signal lines are arranged in the opening areas of the sub-pixels to improve the aperture ratio of the liquid crystal display panel. Although this setting method can improve the aperture ratio, it is necessary to arrange the touch signal lines in the middle of the opening area, to ensure that the distances between the plurality of electrode patterns included in the pixel electrodes located in the opening area and the touch signal lines are symmetrical. It should be noted that a plurality of slits are arranged in the pixel electrode, and the slits in the pixel electrode and electrode patterns are alternately arranged.

However, in the actual manufacturing process of the array substrate, when the manufacturing process of pixel electrode changes, it is easy to make the distance between the touch signal line and the left electrode pattern be asymmetric to the distance between the touch signal line and the right electrode pattern, so that the left and right electric fields formed between the touch signal line and the pixel electrode are asymmetrical, and the left and right electric fields are disordered. The disorder of the left and right electric fields will cause the transmittance of the left side of the touch signal line and the transmittance of the right side of the touch signal line to be deviated, and then there will be visual differences in brightness caused by the transmittance deviation, resulting in the formation of defects of black or white stains.

It should be noted that the left side and the right side mentioned above refer to the left side and the right side which are opposite to each other along the extension direction of the touch signal line.

Figure 2:
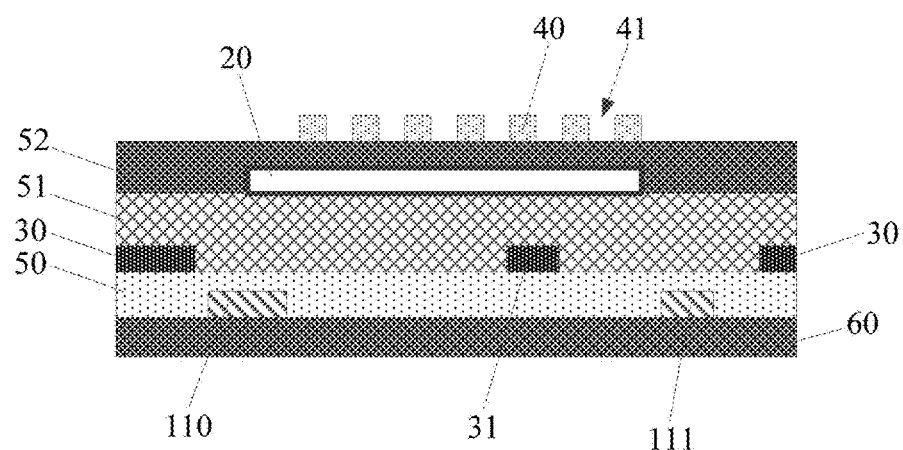
FIG. 2 is a schematic cross-sectional diagram along the A1A2 direction in FIG. 1.
Figure 3:
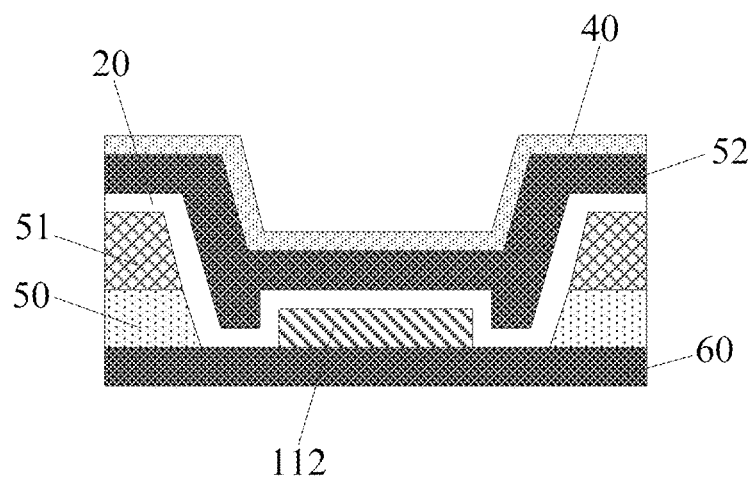
FIG. 3 is the first cross-sectional schematic diagram along the B1B2 direction in FIG. 1.
Figure 20:
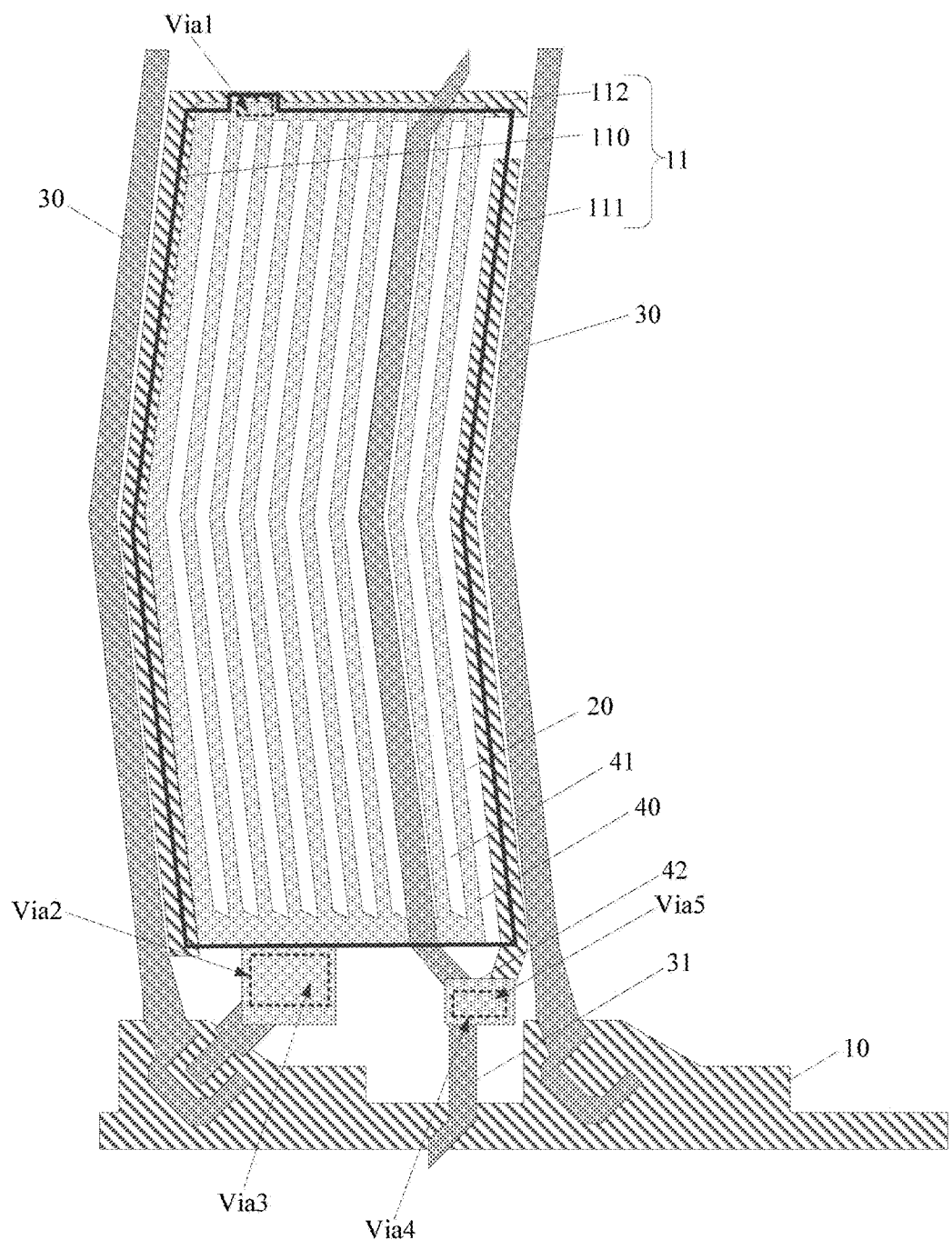
FIG. 20 is a schematic diagram of a second layout of one sub-pixel according to an embodiment of the present disclosure.

Referring to FIG. 1, FIG. 2 and FIG. 20, an embodiment of the present disclosure provides an array substrate, including: a substrate 60, a sub-pixel and a touch signal line 31, the sub-pixel is located on the substrate 60, and the sub-pixel includes a pixel electrode 40 and a common electrode, an orthographic projection of the pixel electrode 40 on the substrate 60 at least partially overlap an orthographic projection of an opening area of the sub-pixel on the substrate 60, and an orthographic projection of the common electrode 20 on the substrate 60 at least partially overlaps the orthographic projection of the opening area of the sub-pixel on the substrate 60, the touch signal line 31 is located on the substrate 60, and an orthographic projection of the touch signal line 31 on the substrate 60 partially overlaps the orthographic projection of the opening area of the sub-pixel on the substrate 60; the touch signal line 31, the common electrode 20 and the pixel electrode 40 are stacked in sequence along the direction away from the substrate 60.

Exemplarily, in the array substrate, the material of the substrate 60 can be selected according to actual needs, and exemplarily, the glass substrate 60 can be selected, but it is not limited to this.

Exemplarily, the opening area corresponding to the sub-pixel is an actual light-transmitting area of the sub-pixel, and the non-opening area corresponding to the sub-pixel is a non-light-transmitting area corresponding to the sub-pixel. For the liquid crystal display panels with a same size, the larger the area of the opening area is, the higher the aperture ratio of the liquid crystal display panel is, and the better the display quality of the liquid crystal display panel is. The non-opening area is located at the periphery of the opening area. Exemplarily, in the array substrate, the driving circuit corresponding to the sub-pixel is located in the non-opening area corresponding to the sub-pixel, and the gate lines 10 and the data lines 30 included in the array substrate are also located in the non-opening area.

It should be noted that the array substrate and the opposite substrate are arranged oppositely to form a display panel, the opposite substrate is provided with a black matrix, and the black matrix can enclose a closed opening area. The orthographic projection of the closed opening area on the substrate partially overlaps the orthographic projection of the pixel electrode on the substrate, and the position of the projection of the closed opening area on the array substrate is the opening area corresponding to the sub-pixels in the array substrate.

Exemplarily, the sub-pixel includes a pixel electrode 40 and a common electrode 20. The pixel electrode 40 and the common electrode 20 are arranged oppositely to each other along a direction perpendicular to the substrate 60. The pixel electrode 40 is coupled to a driving circuit and receives an electrical signal provided by the driving circuit. The pixel electrode 40 and the common electrode 20 together form a driving electric field to drive the liquid crystal in the liquid crystal display panel to deflect, so as to realize the display function of the liquid crystal display panel.

Exemplarily, the array substrate includes a first indium tin oxide layer (1ITO layer) and a second indium tin oxide layer (2ITO layer). 1ITO layer is arranged between the substrate 60 and 2ITO layer, 1ITO layer includes the common electrode 20, 2ITO layer includes the pixel electrode 40.

Exemplarily, the touch signal lines 31 are respectively coupled to corresponding touch electrode units in the array substrate and a chip subsequently bound on the array substrate. After the array substrate and the opposite substrate are arranged oppositely to form a liquid crystal display panel, when a touch operation occurs in the touch area of the liquid crystal display panel, the touch operation can change the touch signal formed on the touch electrode unit in the array substrate, at the same time, the touch signal line 31 is used to transmit the touch signal collected from the touch unit to the chip, and the chip determines the specific position of the touch according to the touch signal received from each touch signal line 31.

When arranging the touch signal line 31, the orthographic projection of the touch signal line 31 on the substrate 60 can be set to overlap the orthographic projections of the opening area of the sub-pixel on the substrate 60; so that the touch signal line is located in the opening area of the sub-pixel, the distance between the touch signal line 31 and the data line 30 in the array substrate is far away, and there is no need to consider the short circuit between the touch signal line 31 and the data line 30. Therefore, in such setting mode, the area of the non-opening area around the sub-pixel can be effectively reduced, so that the pixel aperture ratio of the liquid crystal display panel formed by the array substrate can be increased by about 2%.

Moreover, in the case where the touch signal line 31 is arranged in the non-opening area, when the array substrate and the opposite substrate are arranged oppositely to form a cell, it is necessary to consider the accuracy of the cell from the touch signal line 31. Therefore, it is necessary to increase the area of the black matrix pattern on the opposite substrate. However, in the array substrate provided by the embodiment of the present disclosure, the orthographic projection of the touch signal lines 31 on the substrate 60 partially overlaps the orthographic projection of the opening area of the sub-pixels on the substrate 60, so that when the array substrate and the opposite substrate are arranged oppositely to form a cell, it is not necessary to consider the accuracy of the cell from the touch signal line 31, thereby effectively reducing the area of the black matrix pattern on the opposing substrate.

In the array substrate provided by the embodiment of the present disclosure, the orthographic projection of the pixel electrode 40 on the substrate 60 at least partially overlaps the orthographic projection of the opening area of the sub-pixel on the substrate 60, the orthographic projection of the common electrode 20 on the substrate 60 at least partially overlaps the orthographic projection of the opening area of the sub-pixel on the substrate 60, and the orthographic projection of the touch signal line 31 on the substrate 60 partially overlaps the orthographic projection of the opening area of the sub-pixel on the substrate 60; the touch signal line 31, the common electrode 20 and the pixel electrode 40 are stacked in sequence in a direction away from the substrate 60; so that in the opening area of the sub-pixel, the common electrode 20 is located between the touch signal line 31 and the pixel electrode 40, and the common electrode 20 can play a shielding role between the touch signal line 31 and the pixel electrode 40, which can shield the opening area transmittance deviation caused by the asymmetry of the left and right electric fields formed between the touch signal line 31 and the pixel electrode 40 caused by the process fluctuation of the pixel electrode 40, so as to solve the visual difference of brightness caused by the transmittance deviation and visually formed black stains or white stains, and effectively improve the yield of the product.

Please refer to FIG. 1 and FIG. 2, in some embodiments, the touch signal line 31 includes a first portion, and the orthographic projection of the first portion on the substrate 60 overlaps the orthographic projection of the opening area of the sub-pixel on the substrate 60. The orthographic projection of the first portion of the touch signal line 31 on the substrate 60 at least partially overlaps the orthographic projection of the common electrode 20 on the substrate 60.

The above arrangement enables that in the opening area of the sub-pixel, the orthographic projection of the touch signal line 31 on the substrate 60 at least partially overlaps the orthographic projection of the common electrode 20 on the substrate 60, which better improves the shielding effect of the common electrode 20 between the touch signal line 31 and the pixel electrode 40.

In some embodiments, the orthographic projection of the first portion of the touch signal line 31 on the substrate 60 is completely covered by the orthographic projection of the common electrode 20 on the substrate 60.

The above arrangement further improves the shielding effect of the common electrode 20 between the touch signal line 31 and the pixel electrode 40 in the opening area.

As shown in FIG. 2, in some embodiments, the array substrate further includes: an organic insulating layer 51, and at least part of the organic insulating layer 51 is located between the touch signal line 31 and the common electrode 20.

Exemplarily, in a direction perpendicular to the substrate 60, the touch signal line 31, the organic insulating layer 51 and the common electrode 20 are sequentially stacked in a direction away from the substrate 60.

Exemplarily, the thickness of the organic insulating layer 51 is relatively thick and has a flattening effect.

At least part of the organic insulating layer 51 is located between the touch signal line 31 and the common electrode 20, which increases the distance between the touch signal line 31 and the pixel electrode 40, which is beneficial to improve the problem of the asymmetry of the left and right electric fields formed between the touch signal line 31 and the pixel electrode 40 caused by the process fluctuation of the pixel electrode 40, which improves the transmittance deviation of the opening area, and solves the visual difference in brightness caused by the transmittance deviation and visually formed black stains or white stains, and effectively improves the yield of the product.

As shown in FIG. 1, FIG. 9, FIG. 10 and FIG. 20, in some embodiments, the array substrate further includes:

A function electrode 11, wherein the function electrode 11 includes a first sub-function electrode portion 110 and a second sub-function electrode portion 111, at least part of the first sub-function electrode portion 110 and at least part of the second sub-function electrode portion 111 are both extended along the first direction, the first sub-function electrode portion 110 is located on the first side of the opening area of the sub-pixel, the second sub-function electrode portion 111 is located on the second side of the opening area of the sub-pixel, and the first side and the second side are opposite along the second direction, the second direction intersects the first direction.

Exemplarily, the first direction includes a vertical direction, and the second direction includes a horizontal direction.

Exemplarily, the structure, material and specific arrangement position of the function electrode can be selected according to actual needs. Exemplarily, the function electrode 11 includes a first sub-function electrode portion 110 and a second sub-function electrode portion 111, the extension direction of the first sub-function electrode portion 110 and the extension direction of the second sub-function electrode portion 111 are the same as the extension direction of the data line 30; both the first sub-function electrode portion 110 and the second sub-function electrode portion 111 can be made of materials with light-shielding properties, such as: metal materials, but not limited to this.

As shown in FIG. 1, exemplarily, the orthographic projection of the common electrode 20 on the substrate does not overlap the orthographic projection of the second sub-function electrode portion 111 on the substrate. As shown in FIG. 20, exemplarily, the orthographic projection of the common electrode 20 on the substrate at least partially overlaps the orthographic projection of the second sub-function electrode portion 111 on the substrate.

Exemplarily, when setting the positions of the first sub-function electrode portion 110 and the second sub-function electrode portion 111, the first sub-function electrode portion 110 can be arranged on the first side of the opening area of the sub-pixel, and the second sub-function electrode portion 111 is arranged on the second side of the opening area of the sub-pixel, and the first side and the second side are opposite along the extension direction perpendicular to the data line 30. In this arrangement, the first sub-function electrode portion 110 and the second sub-function electrode portion 111 will not overlap the opening area of the sub-pixel in the direction perpendicular to the substrate 60, which ensures the light transmitting efficiency of the opening area.

In the case where the first sub-function electrode portion 110 and the second sub-function electrode portion 111 adopt the above-mentioned arrangement, when the first sub-function electrode portion 110 and the second sub-function electrode portion 111 are made of light-shielding materials, the first sub-function electrode portion 110 and the second sub-function electrode portion 111 can block the non-openings of the sub-pixels, so that when the array substrate and the opposite substrate are arranged oppositely to form a liquid crystal display panel, the area of the black matrix pattern on the opposite substrate can be effectively reduced.

Figure 9:
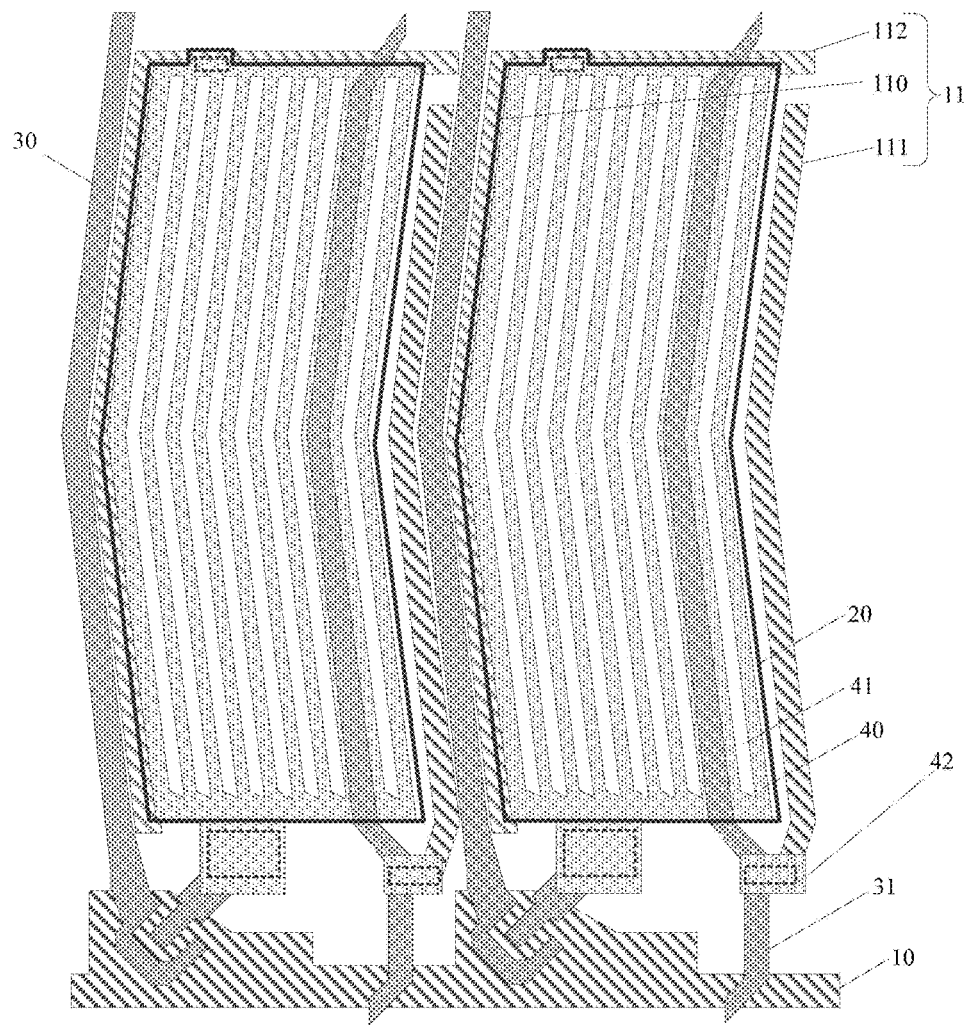
FIG. 9 is a schematic diagram of the layout of two sub-pixels according to an embodiment of the present disclosure.
Figure 10:
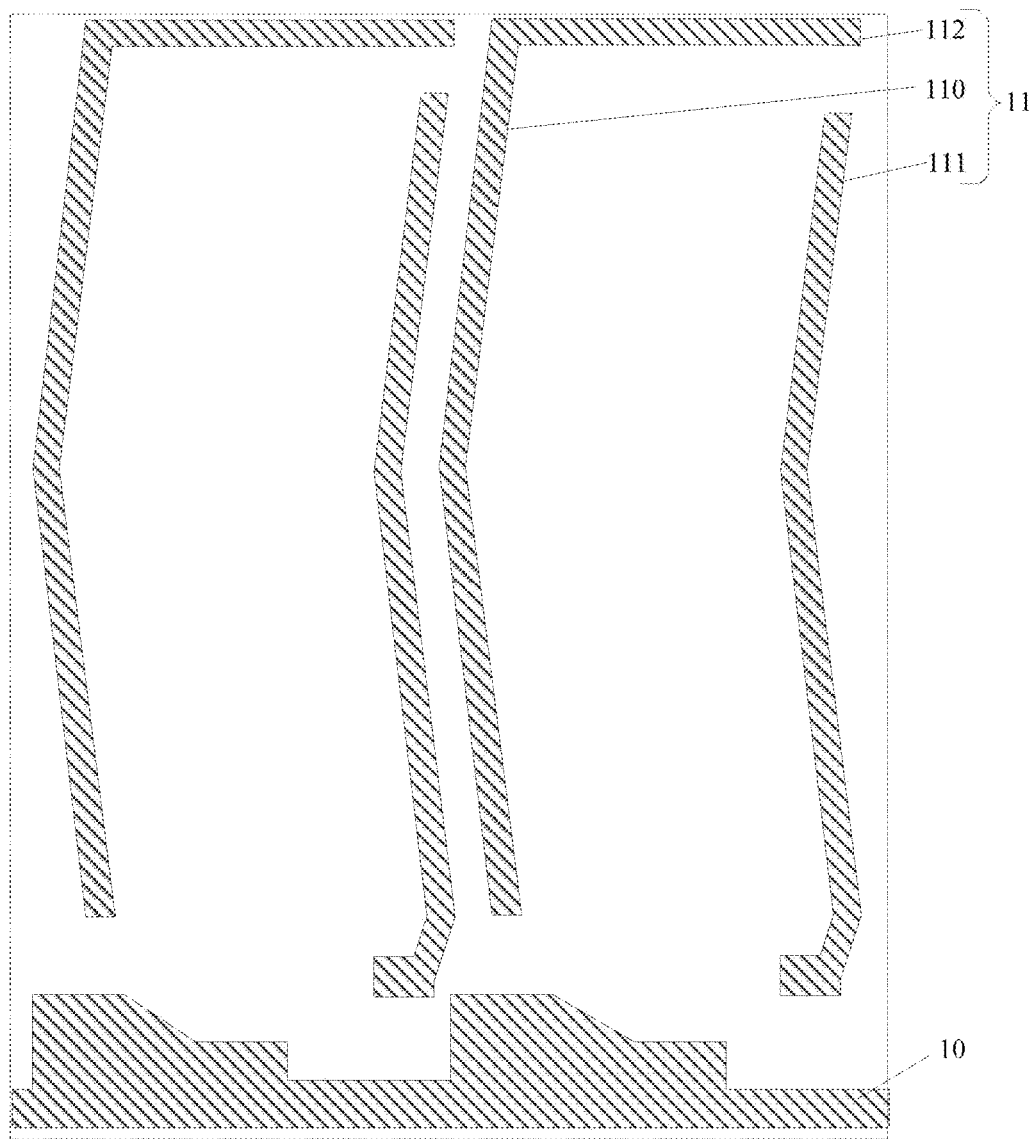
FIG. 10 is a schematic diagram of the layout of the first gate metal layer in FIG. 9.
Figure 11:
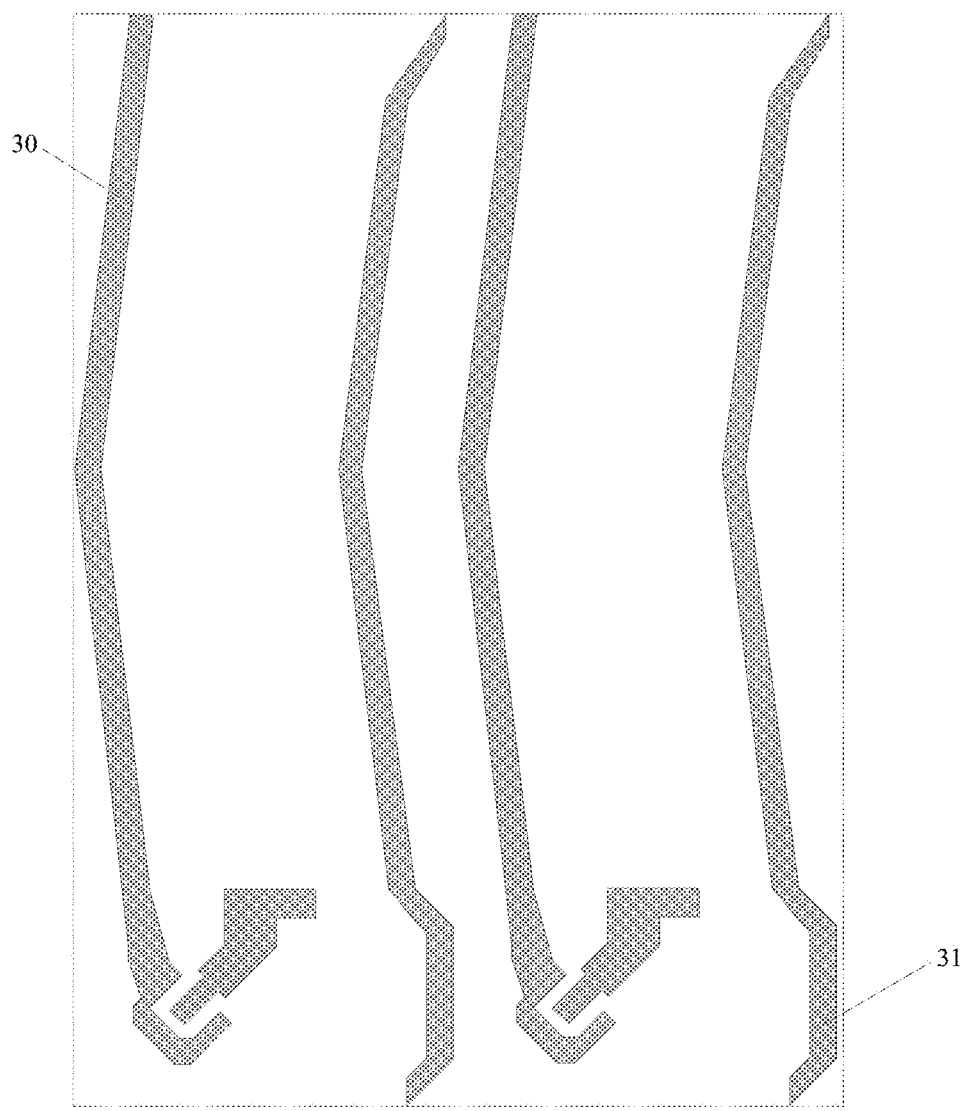
FIG. 11 is a schematic diagram of the layout of the source-drain metal layer in FIG. 9.
Figure 12:
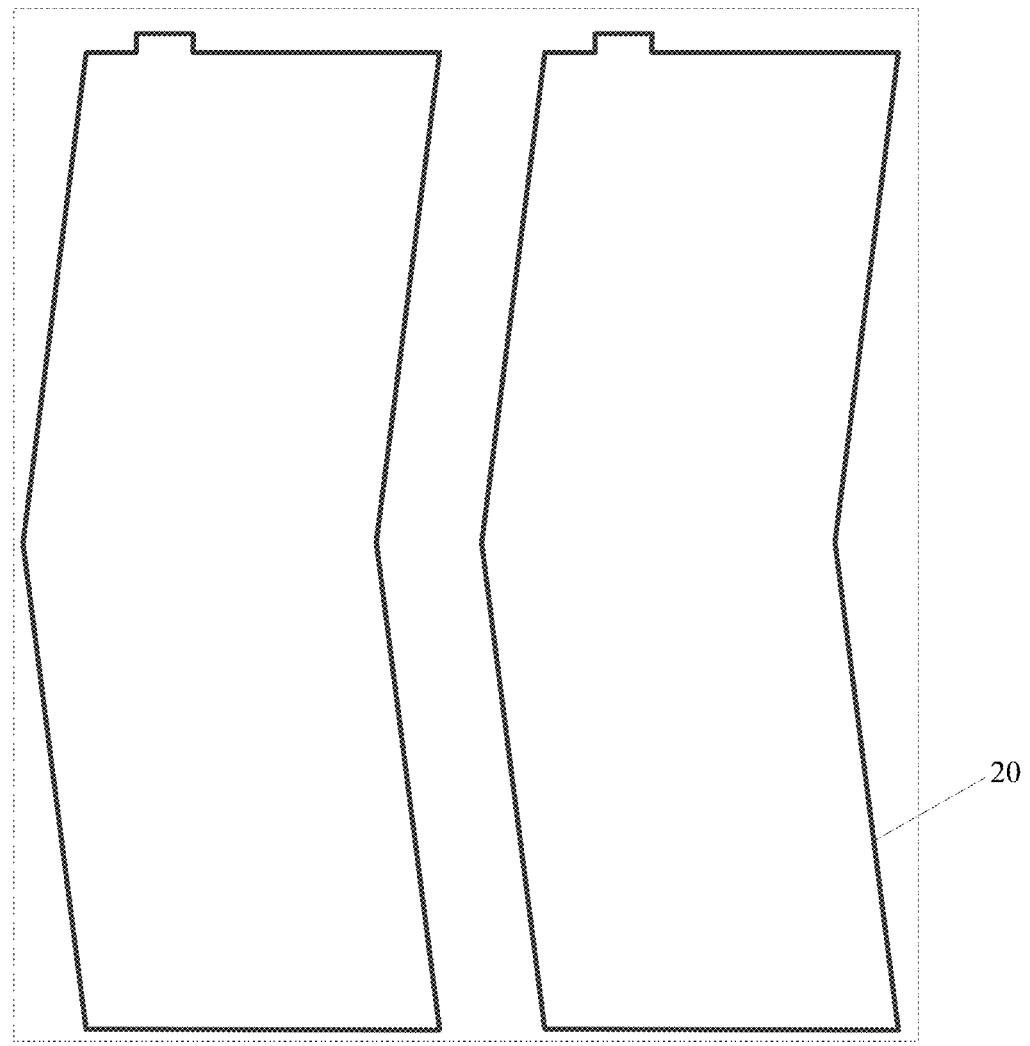
FIG. 12 is a schematic diagram of the layout of the 1ITO layer in FIG. 9.

As shown in FIG. 1, FIG. 9 and FIG. 10, in some embodiments, the function electrode further includes a third sub-function electrode portion 112, at least part of the third sub-function electrode portion 112 extends along the second direction, and the third sub-function electrode portion 112 is respectively electrically connected to the first sub-function electrode portion 110 and the common electrode 20.

Exemplarily, the function electrode further includes a third sub-function electrode portion 112, and the third sub-function electrode portion 112 can also be made of a metal material with light-shielding properties. When the third sub-function electrode portion 112 is actually laid out, the extension direction of the third sub-function electrode portion 112 is the same as the extension direction of the gate lines 10 in the array substrate.

Exemplarily, one end of the third sub-function electrode portion 112 close to the first sub-function electrode portion 110 is electrically connected to the first sub-function electrode portion 110, and at the same time, the orthographic projection of the first sub-function electrode portion 110 on the substrate 60, the orthographic projections of the second sub-function electrode portion 111 on the substrate 60 and the orthographic projections of the third sub-function electrode portion 112 on the substrate 60 are all located around the orthographic projections of the opening area of the sub-pixel on the substrate 60.

Exemplarily, the third sub-function electrode portion 112 and the first sub-function electrode portion 110 form an integral structure. Exemplarily, the first sub-function electrode portion 110, the second sub-function electrode portion 111 and the third sub-function electrode portion 112 are all arranged at the same layer and made of the same material as the gate line 10.

The above-mentioned function electrode further includes a third sub-function electrode portion 112, which can further block the non-opening area of the sub-pixel by the third sub-function electrode portion 112, thereby further reducing the area of the black matrix pattern on the opposite substrate. Moreover, by arranging the third sub-function electrode portion 112 to be electrically connected to the first sub-function electrode portion 110 and the common electrode 20 respectively, the resistance of the common electrode 20 can be effectively reduced, and the loss generated by the common electrode 20 can be reduced.

As shown in FIG. 1, FIG. 3, FIG. 5, FIG. 6 and FIG. 18, in some embodiments, the array substrate further includes: a first insulating layer 50, wherein a third sub-function electrode portion 112, the first insulating layer 50, the organic insulating layer 51 and the common electrode 20 are stacked in sequence along a direction away from the substrate 60; the common electrode 20 is coupled to the third sub-function electrode portion 112 through the first connection hole Via1, and the first connection hole Via1 penetrates through the organic insulating layer 51 and the first insulating layer 50.

Exemplarily, in the first direction, the width of the orthographic projection of the first connection hole Via1 on the substrate 60 is greater than, less than or equal to the width of the third sub-function electrode portion 112.

Exemplarily, the third sub-function electrode portion and the gate line 10 are arranged at the same layer and made of the same material, and the first insulating layer 50 includes the insulating layer of the gate electrode 12.

Exemplarily, the first connection hole Via1 is formed in one patterning process, that is, in one patterning process, the organic insulating layer 51 is first etched to form an opening, and then the first insulating layer 50 is further etched in the opening to form the first connection hole Via1 penetrating through the organic insulating layer 51 and the first insulating layer 50.

Figure 19:
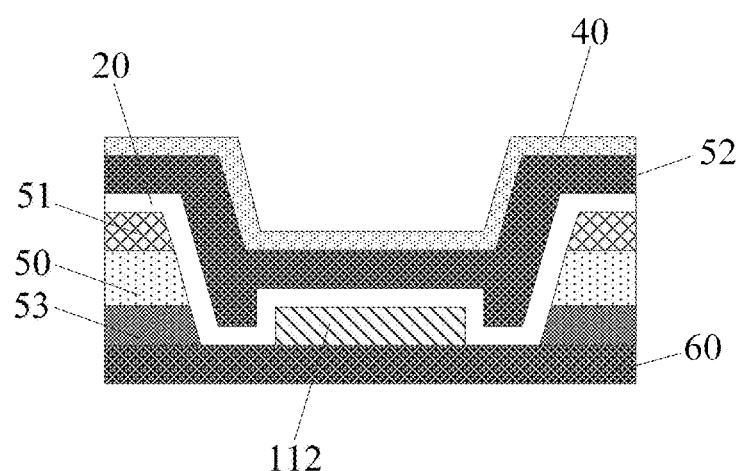
FIG. 19 is a second schematic cross-sectional diagram along the B1B2 direction in FIG. 1.

As shown in FIG. 19, for example, the array substrate further includes a buffer layer 53 located between the first insulating layer 50 and the organic insulating layer 51. In one patterning process, the organic insulating layer 51 is first etched to form an opening, and then the buffer layer 53 and the first insulating layer 50 are further etched in the opening, thereby forming the first connection hole Via 1 penetrating through the organic insulating layer 51, the buffer layer 53 and the first insulating layer 50.

Exemplarily, the orthographic projection of the first connection hole Via1 on the substrate 60 at least partially overlaps the orthographic projection of the third sub-function electrode portion on the substrate 60, and the first connection hole Via1 can expose at least part of the third sub-function electrode portion, the common electrode 20 is coupled to the third sub-function electrode portion through the first connection hole Via1.

In the array substrate provided by the above embodiment, the first connection hole Via1 can be formed in one patterning process, and a portion of the common electrode 20 can be directly deposited in the first connection hole Via1 to realize electrical connection with the third sub-function electrode portion. Therefore, the array substrate provided by the above embodiments does not need to add an additional patterning process, which effectively simplifies the manufacturing process of the array substrate.

Figure 8:
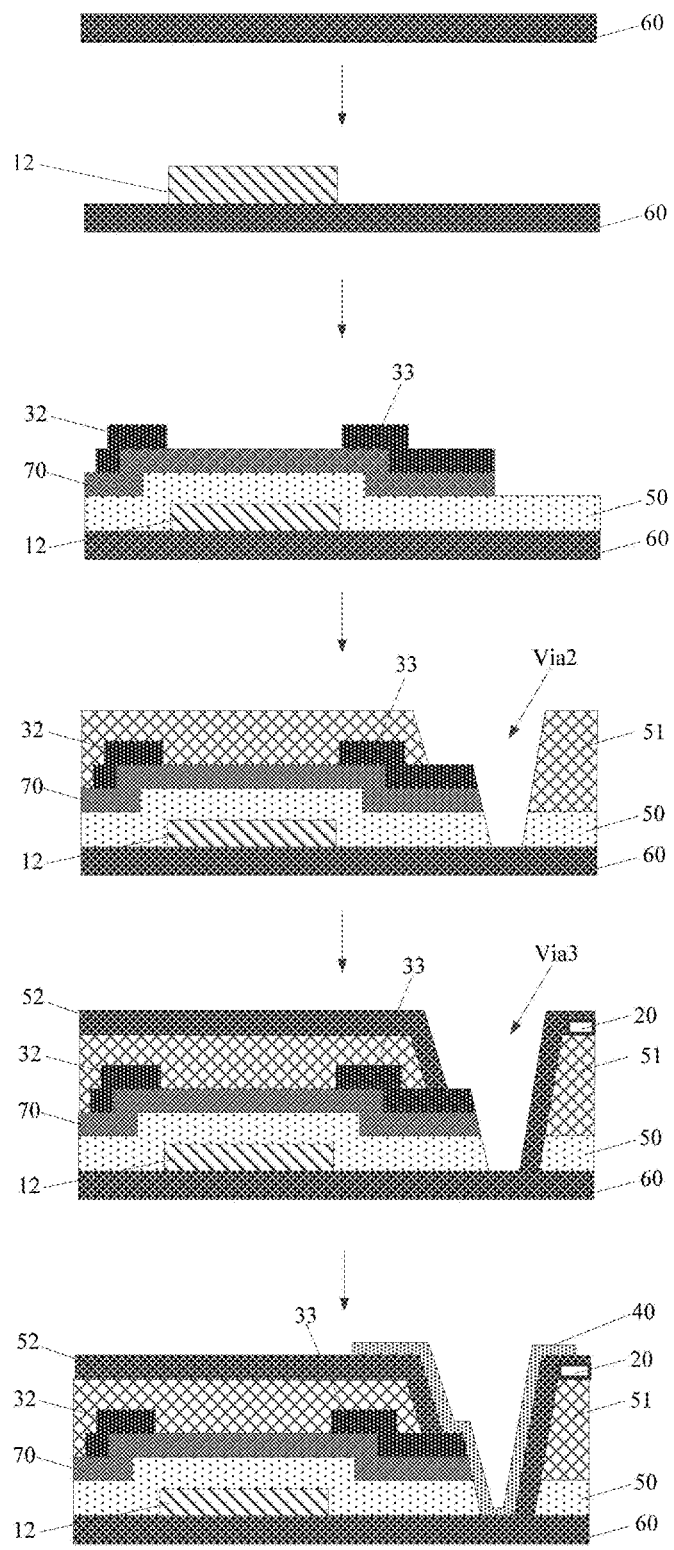
FIG. 8 is a schematic diagram of the connection between an output electrode and a pixel electrode according to an embodiment of the present disclosure.

As shown in FIG. 1 and FIG. 8, in some embodiments, the sub-pixel further includes: a driving circuit, where at least part of the output electrode 33 of the driving circuit is located between the first insulating layer 50 and the organic insulating layer 51; the array substrate further includes a passivation layer 52, at least a part of the passivation layer 52 is located between the common electrode 20 and the pixel electrode 40;

The pixel electrode 40 is coupled to the output electrode 33 through the second connection hole Via2 and the third connection hole Via3, the second connection hole Via2 penetrates the organic insulating layer 51 and the first insulating layer 50, the third connection hole Via3 penetrates the passivation layer 52, the orthographic projection of the second connection hole Via2 on the substrate 60 surrounds the orthographic projection of the third connection hole Via3 on the substrate 60, the orthographic projection of the boundary of the second connection hole Via2 on the substrate 60 at least partially overlaps the orthographic projection of the output electrode 33 on the substrate 60.

Exemplarily, the driving circuit includes a thin film transistor, the gate electrode 12 of the thin film transistor is coupled to the corresponding gate line 10, the input electrode 32 of the thin film transistor is coupled to the corresponding data line 30, and the output electrode 33 of the thin film transistor is used as the output electrode of the driving circuit, the output electrode 33 is coupled to the pixel electrode 40. Exemplarily, the output electrode 33 includes a source electrode of a thin film transistor.

Exemplarily, the output electrode 33 is arranged at the same layer and made of the same material as the data line 30 and the touch signal line 31. Along the direction away from the substrate 60, the first insulating layer 50, the output electrode 33, the organic insulating layer 51, the common electrode 20, the passivation layer 52 and the pixel electrode 40 are stacked in sequence.

Exemplarily, after the organic insulating layer 51 is formed, one patterning process is performed to form openings on the organic insulating layer 51, and the first insulating layer 50 is further etched in the openings, thereby forming the second connection hole Via2 penetrating the organic insulating layer 51 and the first insulating layer 50. Then, a passivation layer 52 is formed, and a next patterning process is performed to pattern the passivation layer 52 to form a third connection hole Via3 penetrating the passivation layer 52. It should be noted that a part of the passivation layer 52 is located in the second connection hole Via2, and the part of the passivation layer 52 is etched to form the third connection hole Via3. The orthographic projection of the second connection hole Via2 on the substrate 60 surrounds the orthographic projection of the third connection hole Via3 on the substrate 60, forming a set of holes. Then, the pixel electrode 40 is formed, and the pixel electrode 40 is coupled to the output electrode 33 through the second connection hole Via2 and the third connection hole Via3.

Figure 7:
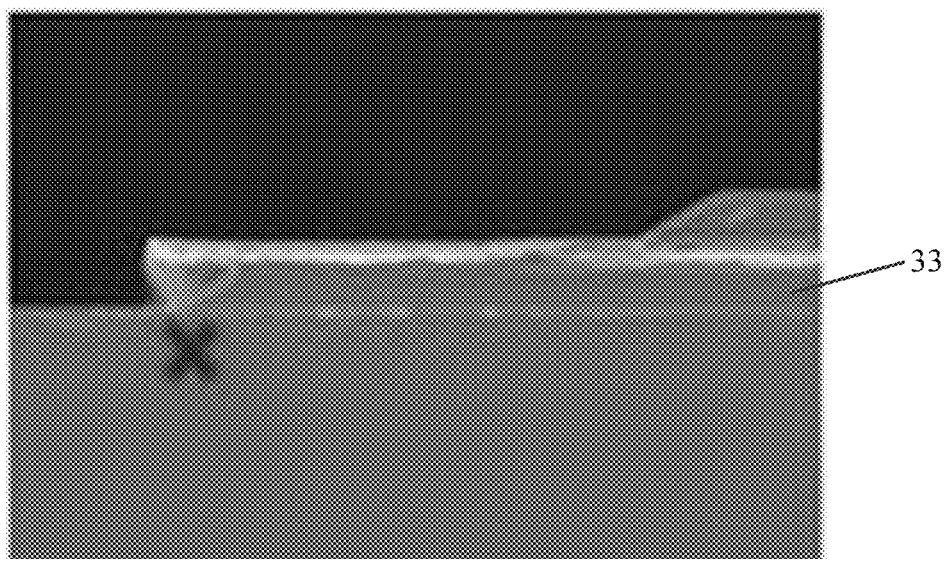
FIG. 7 is a schematic diagram of a notch generated below an edge of the output electrode according to an embodiment of the present disclosure.

It should be noted that, as shown in FIG. 7, in the case where the orthographic projection of the second connection hole Via2 on the substrate 60 is set to surround the orthographic projection of the third connection hole Via3 on the substrate 60, if the orthographic projection of the boundary of the opening on the substrate 60 does not overlap the orthographic projection of the output electrode 33 on the substrate 60, when the first insulating layer 50 is subsequently etched, the problem of over-etching will occur, that is, the first insulating layer 50 under the edge of the output electrode 33 exposed by the opening will be etched to form a undercut, so that the first insulating layer 50 under the edge of the output electrode 33 has a notch that is recessed below the output electrode 33 (the position of the cross line in FIG. 7), which makes the subsequently formed pixel electrode 40 be easily broken at the notch, thereby causing an open circuit between the pixel electrode 40 and the driving circuit, and the driving circuit cannot provide a signal to the pixel electrode 40.

In the display substrate provided by the above embodiment, the orthographic projection of the boundary of the second connection hole Via2 on the substrate 60 at least partially overlaps the orthographic projection of the output electrode 33 on the substrate 60, so that at least part of the boundary of the second connection hole Via2 can be located on the output electrode 33, and then at least part of the boundary of the third connection hole Via3 can be located on the output electrode 33, which can prevent the pixel electrode 40 from being completely disconnected at the boundary of the output electrode 33, thereby ensuring good connection between the pixel electrode 40 and the output electrode 33.

In the array substrate provided by the above embodiment, the first connection hole Via1 and the second connection hole Via2 can be formed in the same patterning process, which not only simplifies the manufacturing process of the array substrate, but also ensures good connection between the pixel electrode 40 and the output electrode 33.

It should be noted that, in the related art, in order to solve the above-mentioned over-etching problem, the passivation layer 52 will be directly formed after forming opening on the organic insulating layer 51, and then one patterning process will be performed on the passivation layer 52 first, and the first insulating layer 50 to be etched and located in a part of the opening is exposed, and then the first insulating layer 50 is etched to form the first connection hole Via1; then the passivation layer 52 is subjected to the next patterning process to form the third connection hole Via3. Therefore, in the array substrate provided by the above embodiments, only one patterning process needs to be performed on the passivation layer 52, which saves one Mask.

As shown in FIG. 9 to FIG. 13 and FIG. 15, in some embodiments, the array substrate further includes:

A plurality of gate lines 10, a plurality of data lines 30 and a plurality of sub-pixels; wherein the plurality of gate lines 10 and the plurality of data lines 30 cross to each other to form a plurality of sub-pixel areas, and a plurality of opening areas included in the plurality of sub-pixels are located in the plurality of sub-pixel areas in a one-to-one corresponding manner; the plurality of sub-pixels includes a plurality of sub-pixel columns, and each sub-pixel column includes a plurality of sub-pixels arranged along the first direction;

A touch electrode layer arranged in a touch area of the array substrate, wherein the touch area includes a plurality of touch sub-areas 80, the touch electrode layer includes a plurality of touch electrode units, and the touch electrode units are located in the plurality of touch sub-areas 80 in a one-to-one corresponding manner; and, A plurality of touch signal lines 31 coupled to a plurality of touch electrode units in a one-to-one corresponding manner, the touch signal lines 31 correspond to target sub-pixel columns in the plurality of sub-pixel columns in a one-to-one manner, and an orthographic projection of the touch signal line 31 on the substrate 60 partially overlaps the orthographic projection of the opening area of each sub-pixel in the corresponding target sub-pixel column on the substrate 60.

Exemplarily, the plurality of sub-pixels includes a plurality of red sub-pixels, a plurality of green sub-pixels and a plurality of blue sub-pixels, and the target sub-pixel column includes sub-pixels of one or more colors.

Exemplarily, the data lines 30 are arranged to intersect with the gate lines 10. Exemplarily, the data lines 30 extend along the first direction, and the gate lines 10 extend along the second direction.

Exemplarily, the array substrate may include a plurality of gate lines 10 and a plurality of data lines 30, and the plurality of gate lines 10 and the plurality of data lines 30 intersect each other to enclose a plurality of sub-pixel regions arranged in an array on the substrate 60. The plurality of opening regions included in the plurality of sub-pixels are located in the plurality of sub-pixel areas in a one-to-one corresponding manner.

Exemplarily, the plurality of sub-pixels includes a plurality of sub-pixel columns arranged along the second direction, and each sub-pixel column includes a plurality of sub-pixels arranged along the first direction.

Exemplarily, the touch electrode layer included in the array substrate may be located in the touch area of the array substrate, the touch electrode layer includes a plurality of touch electrode units independent from each other, and the plurality of touch electrode units may be arranged in an array, but not limited to this. The touch area can be divided into a plurality of touch sub-areas 80, and the touch electrode units are located in the touch sub-areas 80 in a one-to-one corresponding manner. It is worth noting that the specific position of the touch area can be set according to actual needs. Exemplarily, after the liquid crystal display panel is formed on the array substrate, the touch area coincide with the entire display area of the liquid crystal display panel; or the touch area is arranged in the display area, and only coincides with a specified area in the display area.

Exemplarily, each touch electrode unit is coupled to a corresponding touch signal line 31, and one end of the touch signal line 31 away from the touch electrode unit can be coupled to a chip subsequently bound on the array substrate. After the array substrate and the opposite substrate are arranged oppositely to form a liquid crystal display panel, when a touch operation occurs in the touch area of the liquid crystal display panel, the touch operation can change the touch signal formed on the touch electrode unit in the array substrate, at the same time, the touch signal lines 31 are used to transmit the touch signals collected from the touch unit to the chip, and the chip determines the specific position of the touch according to the touch signal received from each touch signal line 31.

Exemplarily, when setting the touch signal line 31, the orthographic projection of the touch signal line 31 on the substrate 60 may be set to overlap the orthographic projections of the opening area of each sub-pixel in the corresponding target sub-pixel columns on the substrate 60; this arrangement makes the touch signal line 31 located in the opening area corresponding to a part of sub-pixels, so that the touch signal line 31 and the data line 30 are far apart, and there is no need to consider the short circuit between the touch signal line 31 and the data line 30. Therefore, this arrangement can effectively reduce the area of the non-opening area around each sub-pixel, thereby increasing the pixel aperture ratio of the liquid crystal display panel formed by the array substrate by about 2%.

Moreover, in the array substrate provided by the above-mentioned embodiment, the orthographic projection of the touch signal line 31 on the substrate 60 partially overlaps the orthographic projection of the opening area of each sub-pixel in the corresponding target sub-pixel column on the substrate 60, so that when the array substrate and the opposing substrate are arranged oppositely to form a cell, it is not necessary to consider the cell accuracy from the touch signal lines 31, thereby effectively reducing the area of the black matrix pattern on the opposing substrate.

In some embodiments, a plurality of common electrodes 20 located in the same touch sub-area 80 are coupled to each other, and the plurality of common electrodes 20 are multiplexed as touch electrode units in the touch sub-area 80.

In the array substrate provided by the above embodiment, the common electrodes 20 located in the same touch sub-area 80 can be multiplexed into the touch electrode unit in the touch sub-area 80, so as to avoid the need for additional touch electrode unit in the array substrate. Moreover, since the common electrode 20 is coupled to the corresponding first sub-function electrode portion 110 and the third sub-function electrode portion 112, and the common electrodes 20 located in the same touch sub-area 80 are all coupled together, the resistance of the common electrode 20 is low, and the loss is small. Therefore, when the common electrodes 20 located in the same touch sub-area 80 are multiplexed as touch electrode units in the touch sub-area 80, the resistance of the touch electrode unit is relatively low, thereby effectively reducing the loss on the touch signal line 31, improving the touch sensitivity, and improving product competitiveness and added value (i.e., touch function).

In the case where the common electrodes 20 located in the same touch sub-area 80 are multiplexed into touch electrode units in the touch sub-area 80, after the liquid crystal display panel is formed by using the array substrate, the specific process of using the liquid crystal display panel to realize the touch display function is as follows:

In a touch phase, the touch signal line 31 provides a touch signal. When a touch operation occurs in the touch area of the liquid crystal display panel, the touch signal corresponding to the touch electrode unit at the position where the touch operation occurs will change. The touch electrode unit transmits the changed touch signal to the chip through the corresponding touch signal line 31, and the chip determines the specific position where the touch operation occurs based on the changed touch signal.

In a display phase, the touch signal line 31 provides the signal of the common electrode 20 required for display, and the sub-pixel driving circuit in the array substrate provides the driving signal for the corresponding pixel electrode 40, so that an electric field that drives the deflection of the liquid crystal is generated between the pixel electrode 40 and the common electrode 20, which enables the liquid crystal display panel to realize the display function.

Figure 14:
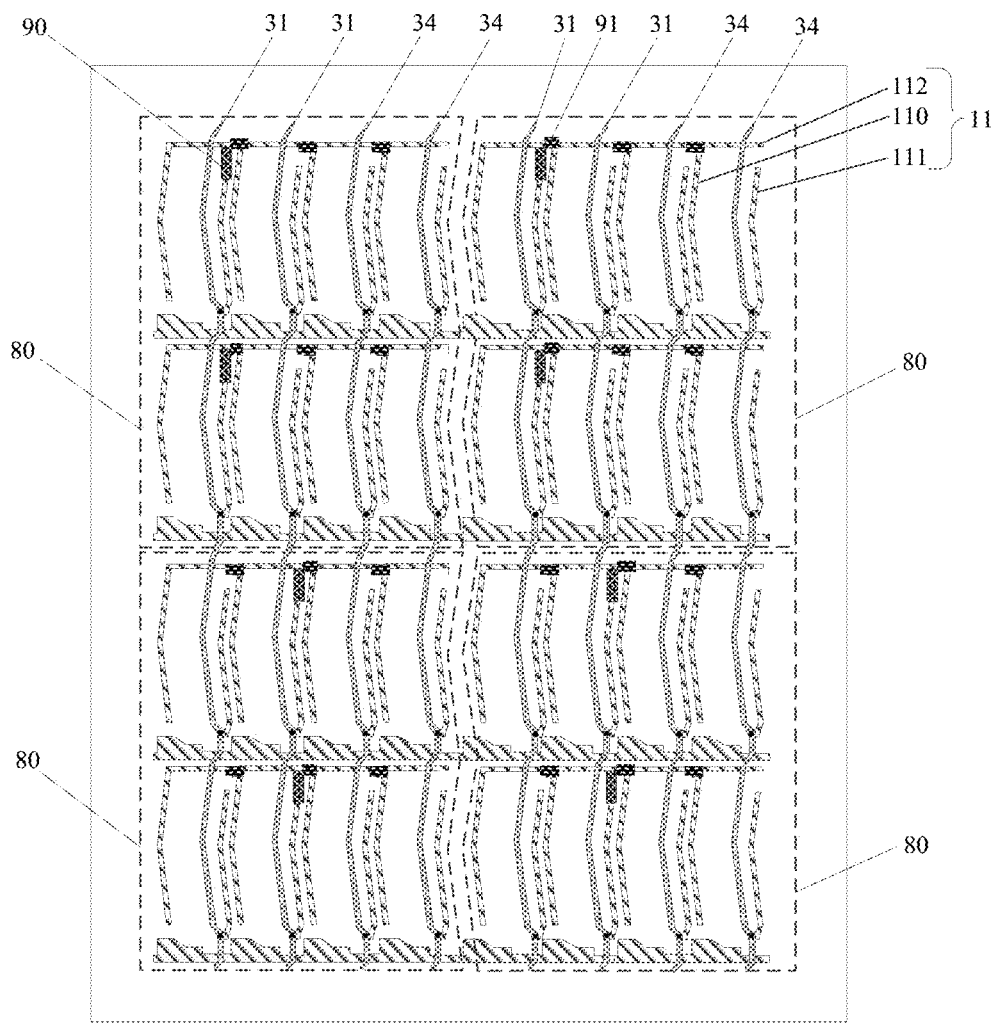
FIG. 14 is a first schematic diagram of the coupling of sub-function electrode portions in the same touch sub-region according to an embodiment of the present disclosure.
Figure 15:
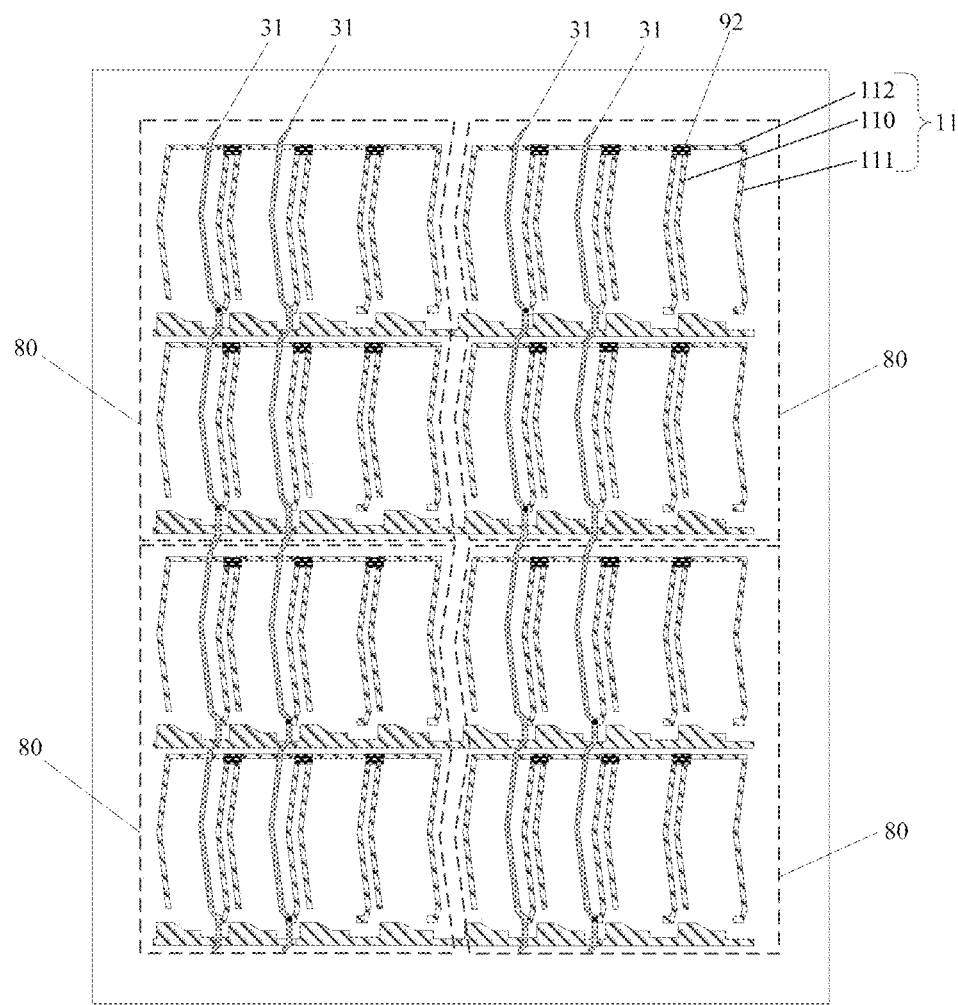
FIG. 15 is a second schematic diagram of the coupling of sub-function electrode portions in the same touch sub-region according to an embodiment of the present disclosure.
Figure 16:
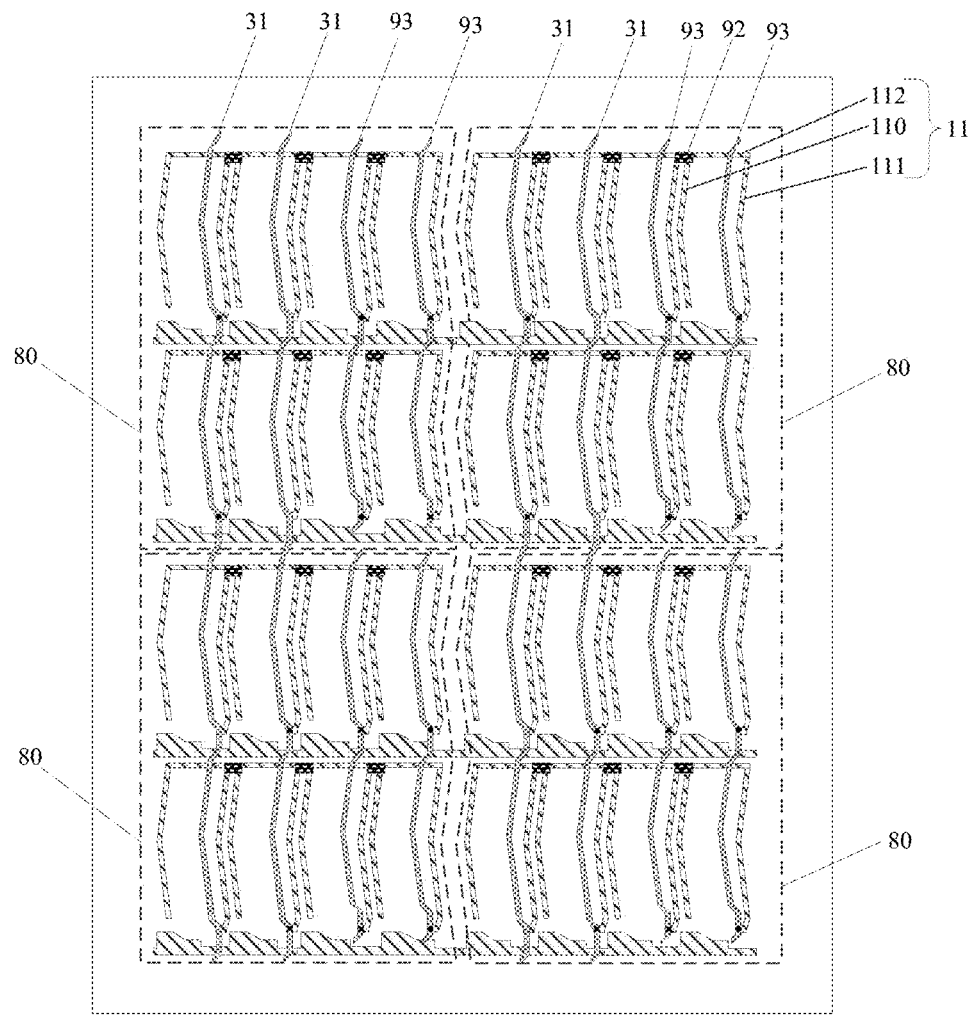
FIG. 16 is a schematic diagram of the compensation pattern in the same touch sub-region according to an embodiment of the present disclosure.

As shown in FIG. 14 to FIG. 16, in some embodiments, the array substrate further includes: a plurality of function electrodes 11 corresponding to the plurality of sub-pixels in a one-to-one manner, and the touch signal line 31 is coupled to the second sub-function electrode portion 111 corresponding to at least part of target sub-pixels included in the target sub-pixel column corresponding to the touch signal line 31, and the target sub-pixels included in the target sub-pixel column corresponding to the touch signal line 31 are located in the touch sub-area 80 corresponding to the touch signal line 31.

Exemplarily, the second sub-function electrode portion 111 can be made of a conductive material, which can be specifically used as a shield bar in the array substrate.

The touch signal line 31 is coupled to the second sub-function electrode portion 111 corresponding to at least part of the target sub-pixels, so that the touch signal line 31 have a smaller resistance, which is more conducive to reducing the loss generated when the touch signal line 31 transmits a signal.

As shown in FIG. 1, FIG. 4, FIG. 9 and FIG. 13, in some embodiments, the target sub-pixel includes a connection pattern 42, the connection pattern 42 and the pixel electrode 40 are arranged at the same layer and made of the same material, and the connection pattern 42 is respectively coupled to the second sub-function electrode portion 111 corresponding to the target sub-pixel and the corresponding touch signal line 31.

The connection pattern 42 and the pixel electrode 40 are arranged at the same layer and made of the same material, so that the connection pattern 42 and the pixel electrode 40 can be formed in the same patterning process, which is beneficial to simplify the manufacturing process of the array substrate and reduce the manufacturing cost of the array substrate.

Figure 4:
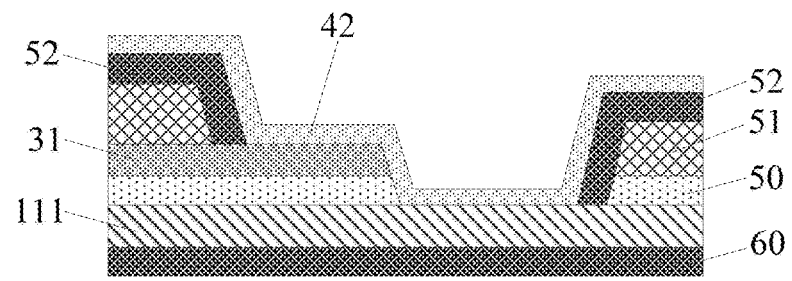
FIG. 4 is a schematic cross-sectional diagram along the C1C2 direction in FIG. 1.
Figure 5:
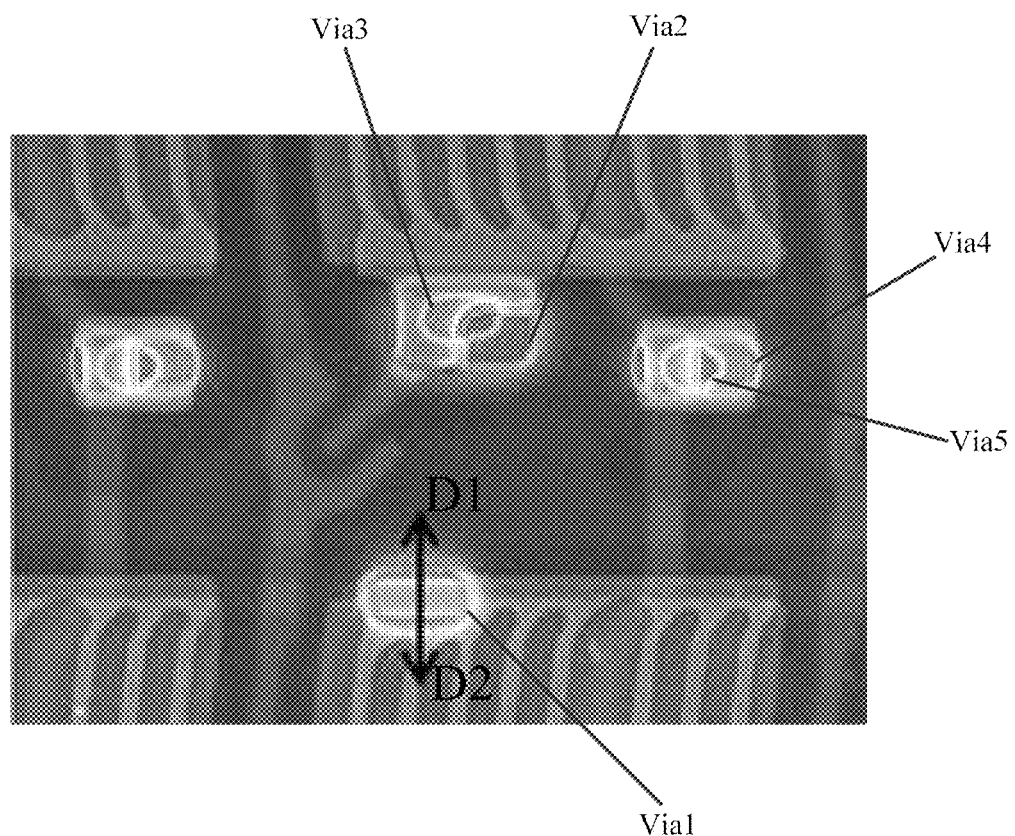
FIG. 5 is an electron microscope diagram of the first connection hole to the fifth connection hole according to an embodiment of the present disclosure.
Figure 6:
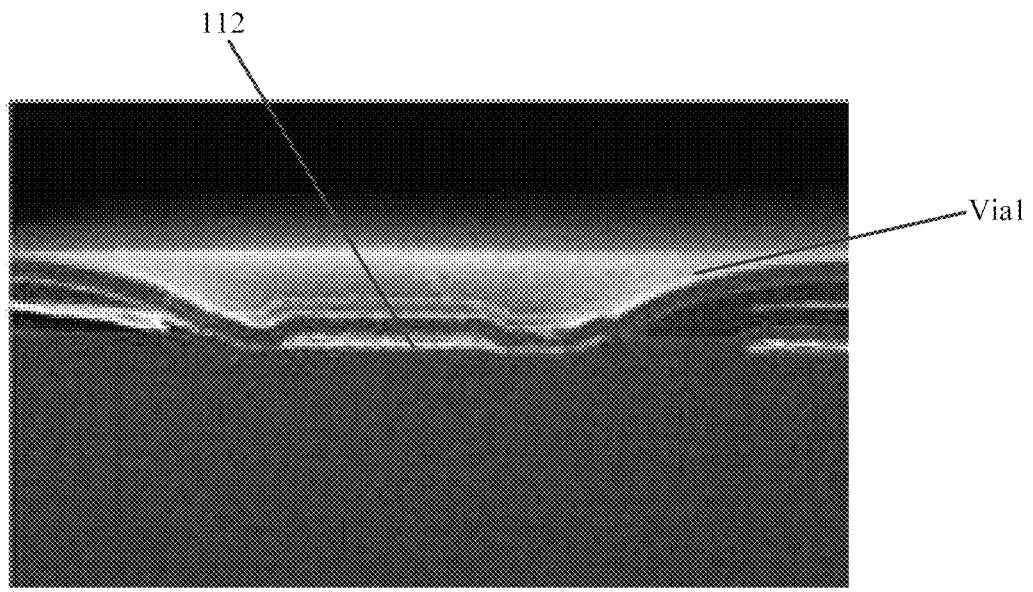
FIG. 6 is a schematic cross-sectional diagram along the D1D2 direction in FIG. 5.

As shown in FIG. 1, FIG. 4 and FIG. 5, in some embodiments, the connection pattern 42 is coupled to the corresponding touch signal line 31 through a fourth connection hole Via4 and a fifth connection hole Via5, and the fourth connection hole Via4 penetrates the organic insulating layer 51 and the first insulating layer 50, the fifth connection hole Via5 penetrates the passivation layer 52, the orthographic projection of the fourth connection hole Via4 on the substrate 60 surrounds the orthographic projection of the fifth connection hole Via5 on the substrate 60, the orthographic projection of the boundary of the fourth connection hole Via4 on the substrate 60 at least partially overlaps the orthographic projection of the corresponding touch signal line 31 on the substrate 60.

As shown in FIG. 1, FIG. 4 and FIG. 5, in some embodiments, the connection pattern 42 is coupled to the corresponding second sub-function electrode portion 111 through the fourth connection hole Via4 and the fifth connection hole Via5.

Exemplarily, the fourth connection hole Via4 is formed in the same patterning process as the first connection hole Via1 and the second connection hole Via2. The fifth connection hole Via5 and the third connection hole Via3 are formed in the same patterning process.

Exemplarily, after the organic insulating layer 51 is formed, one patterning process is performed to form openings on the organic insulating layer 51, and the first insulating layer 50 is further etched in the openings, thereby forming a first connection hole Via1, a second connection hole Via2 and a fourth connection hole Via4 penetrating the organic insulating layer 51 and the first insulating layer 50. Then, a passivation layer 52 is formed, and a next patterning process is performed to pattern the passivation layer 52 to form a third connection hole Via3 and a fifth connection hole Via5 penetrating the passivation layer 52. It should be noted that a part of the passivation layer 52 is located in the second connection hole Via2 and the fourth connection hole Via4, and the part of the passivation layer 52 is etched to form the third connection hole Via3 and the fifth connection hole Via5, and the orthographic projection of the second connection hole Via2 on the substrate 60 surrounds the orthographic projection of the third connection hole Via3 on the substrate 60 to form a set of holes; the orthographic projection of the fourth connection hole Via4 on the substrate 60 surrounds the orthographic projection of the fifth connection hole Via5 on the substrate 60 to form a set of holes. Then a connection pattern 42 is formed, and the connection pattern 42 is respectively coupled to the corresponding touch signal line 31 and the corresponding second sub-function electrode portion 111 through the fourth connection hole Via4 and the fifth connection hole Via5 function electrode part 111 through the fourth connection hole Via4 and the fifth connection hole Via5.

It should be noted that in the case where the orthographic projection of the fourth connection hole Via4 on the substrate 60 is set to surround the orthographic projection of the fifth connection hole Via5 on the substrate 60, if the orthographic projection of the boundary of the opening on the substrate 60 does not overlap the orthographic projections of the touch signal line 31 on the substrate 60, when the first insulating layer 50 is subsequently etched, there will be an over-etching problem, that is, the first insulating layer 50 under the edge of the touch signal line 31 exposed by the opening will be etched to form an undercut, so that the first insulating layer 50 under the edge of the touch signal line 31 has a notch that is recessed below the touch signal line 31, so that the subsequently formed connection pattern 42 is broken at the notch, and the touch signal line 31 and the corresponding second sub-function electrode portion 111 cannot be electrically connected together.

In the display substrate provided by the above embodiment, the orthographic projection of the boundary of the fourth connection hole Via4 on the substrate 60 at least partially overlaps the orthographic projection of the touch signal line 31 on the substrate 60, so that at least part of the boundary of the fourth connection hole Via4 is located on the touch signal line 31, and at least part of the boundary of the fifth connection hole Via5 can be located on the touch signal line 31, so as to prevent the connection pattern 42 from being completely disconnected on the boundary of the touch signal line 31, thereby ensuring good connection performance between the touch signal line 31 and the second sub-function pattern.

As shown in FIG. 14 to FIG. 16, in some embodiments, the touch signal lines 31 are arranged to be respectively coupled to the second sub-function electrode portions 111 corresponding to the sub-pixels in the corresponding target sub-pixel column.

The above arrangement further reduces the resistance of the touch signal line 31, thereby further reducing the loss of the touch signal line 31 during signal transmission.

In the array substrate provided in the above embodiment, the touch signal line 31 is coupled to the corresponding second sub-function electrode portion 111 to realize the coupling of the touch signal line 31 and the corresponding touch electrode unit, so that the touch signal line 31 is coupled to the corresponding touch electrode unit in the non-opening area, thereby avoiding the formation of a via hole in the opening area for coupling the touch signal line 31 and the touch electrode unit. When applying the array substrate to the liquid crystal display panel, the display quality of the liquid crystal display panel is effectively improved.

As shown in FIG. 14, in some embodiments, the array substrate further includes: a first conductive connection portion 90 and a second conductive connection portion 91;

Among the function electrodes corresponding to each target sub-pixel, the third sub-function electrode portion 112 is coupled to the second sub-function electrode portion 111 through the first conductive connection portion 90;

In the function electrodes corresponding to the sub-pixels located in the same touch sub-area 80, in the second direction, adjacent third sub-function electrode portions 112 are coupled through the second conductive connection portions 91. Exemplarily, the third sub-function electrode portion 112 and the second conductive connection portion 91 are formed as an integral structure.

Specifically, the target sub-pixels included in the target sub-pixel column corresponding to the touch signal line 31 are located in the touch sub-area 80 corresponding to the touch signal line 31; and among the function electrodes corresponding to each target sub-pixel, the third sub-function electrode portion 112 and the second sub-function electrode portion 111 are coupled through the first conductive connection portion 90; and among the function electrodes corresponding to each target sub-pixel in the same touch sub-area 80; in the extension direction of the gate line 10, adjacent third sub-function electrode portions 112 are coupled through the second conductive connection portion 91; so that all the first sub-function electrode portions 110 located in the same touch sub-area 80 and the third sub-function electrode portions 112 are coupled together. At the same time, all the first sub-function electrode portions 110 located in the same touch sub-area 80 and the third sub-function electrode portions 112 are coupled to the corresponding touch signal line 31 through the second sub-function electrode portion 111 corresponding to each target sub-pixel in the touch sub-area 80. Because the first sub-function electrode portion 110 and the third sub-function electrode portion 112 are both coupled to the corresponding common electrode 20, so that all the common electrodes 20 in the same touch sub-area 80 are coupled together.

In some embodiments, the first conductive connecting portion 90 is made of a conductive material. Exemplarily, the first conductive connecting portion 90 and the data line 30 can be arranged at the same layer and made of the same material. When the first conductive connecting portion 90 and the data line 30 are arranged at the same layer and made of the same material, the first conductive connecting portion 90 and the data line 30 can be simultaneously formed through one patterning process, which greatly simplifies the manufacturing process of the array substrate and saves the manufacturing cost.

In some embodiments, the first conductive connection portion 90 and the second conductive connection portion 91 can be arranged at the same layer and made of the same material as the function electrode.

Specifically, since the second conductive connection portion 91 is used to couple the two third sub-function electrode portions 112 adjacent to each other along the extension direction of the gate line 10 in the same touch sub-area 80, the second conductive connection portion 91 does not need to cross the gate line 10, so that when the second conductive connection portion 91 and the function electrodes (including the first sub-function electrode portion 110, the second sub-function electrode portion 111 and the third sub-function electrode portion 112) are arranged at the same layer and made of the same material, it can be ensured that no short circuit occurs between the second conductive connection portion 91 and the gate line 10.

In addition, the first conductive connection portion 90, the second conductive connection portion 91 and the function electrode are arranged at the same layer and made of the same material, so that the first conductive connection portion 90, the second conductive connection portion 91 and the function electrode can be simultaneously manufactured through one patterning process, to avoid adding an additional patterning process used to manufacture the first conductive connection portion 90 and the second conductive connection portion 91, thereby simplifying the manufacturing process of the array substrate and saving the manufacturing cost.

In some embodiments, the first conductive connection portion 90 and the second conductive connection portion 91 are arranged at different layers from the function electrode. In this case, the coupling can be achieved by punching holes.

As shown in FIG. 14, in some embodiments, the array substrate further includes a plurality of compensation signal lines 34, the compensation signal lines 34 correspond to non-target sub-pixel columns in the plurality of sub-pixel columns in a one-to-one manner, and the orthographic projection of the compensation signal line 34 on the substrate 60 overlaps the orthographic projection of the opening area of each sub-pixel in the corresponding non-target sub-pixel column on the substrate 60;

The compensation signal line 34 is respectively coupled to the second sub-function electrode portion 111 corresponding to each sub-pixel in the corresponding non-target sub-pixel column.

Specifically, a plurality of compensation signal lines 34 may also be arranged on the array substrate. The compensation signal lines 34 may have the same structure as the touch signal lines 31, and the compensation signal lines 34 may be coupled to the second sub-function electrode portion 111 corresponding to each sub-pixel in the non-target sub-pixel column; the above-mentioned structure of arranging a plurality of compensation signal lines 34 enables the touch signal lines 31 and the compensation signal lines 34 to be evenly distributed on the entire array substrate. When the array substrate of such structure is applied in a display panel, it is more beneficial to improve the display uniformity of the display panel.

It should be noted that in the non-target sub-pixel column, the second sub-function electrode portion 111 corresponding to each sub-pixel is disconnected from the first sub-function electrode portion 110 and the third sub-function electrode portion 112, that is, the second sub-function electrode portion 111 corresponding to each sub-pixel is insulated from the first sub-function electrode portion 110 and the third sub-function electrode portion 112.

In addition, the compensation signal line 34 and the touch signal line 31 can be arranged at the same layer and made of the same material, so that the compensation signal line 34 and the touch signal line 31 can be formed in the same patterning process, avoiding an additional patterning process specially used for manufacturing the compensation signal lines 34, thereby effectively simplifying the manufacturing process of the array substrate and saving the manufacturing cost.

As shown in FIG. 15, in some embodiments, the third sub-function electrode portion 112 is electrically connected to the second sub-function electrode portion 111;

The array substrate further includes: a third conductive connection portion 92, the third conductive connection portion 92 is respectively coupled to the two third sub-function electrode portions 112 adjacent to each other along the second direction in the same touch sub-area 80. Exemplarily, the third conductive connection portion 92 and the third sub-function electrode portion 112 are formed as an integral structure.

The target sub-pixels included in the target sub-pixel column corresponding to the touch signal line 31 are arranged in the touch sub-area 80 corresponding to the touch signal line 31; and the third conductive connection portion 92 is coupled to two adjacent third sub-function electrode portions 112 in the extension direction of the gate line 10 in the same touch sub-area 80; so that all function electrodes 11 in the same touch sub-area 80 (including the first sub-function electrode portion 110, the second sub-function electrode portion 111 and the third sub-function electrode portion 112) are coupled together, so that all function electrodes located in the same touch sub-area 80 can be coupled to the corresponding touch signal lines 31 at the same time; and since the function electrodes are all coupled to the corresponding common electrodes 20, all the common electrodes 20 in the same touch sub-area 80 are coupled together.

When the common electrodes 20 located in the same touch sub-area 80 are multiplexed into the touch electrode unit in the touch sub-area 80, the resistance of the touch electrode unit is lower, thereby effectively reducing the loss on the touch signal line 31, improving the touch sensitivity, and improving the overall product competitiveness and added value (i.e., touch function).

As shown in FIG. 16, in some embodiments, the array substrate further includes:

A plurality of compensation patterns 93, the plurality of compensation patterns 93 are in one-to-one correspondence with the non-target sub-pixel columns included in the plurality of touch sub-areas 80, and each compensation pattern 93 is coupled to the corresponding second sub-function electrode portion 111 corresponding to each non-target sub-pixel in the corresponding non-target sub-pixel column;

The orthographic projection of each compensation pattern 93 on the substrate 60 partially overlaps the orthographic projection of the opening area of the corresponding non-target sub-pixel on the substrate 60; each compensation pattern 93 is arranged at the same layer and made of the same material as the touch signal line 31, and has the same extension direction as the touch signal line 31.

Exemplarily, the extension length of the compensation pattern 93 is substantially the same as the length of the touch sub-area 80 in the extension direction of the compensation pattern 93. Exemplarily, among the non-target sub-pixel columns in the same column, the sum of the extension lengths of the compensation patterns 93 corresponding to the non-target sub-pixel columns is approximately the same as the extension length of the touch signal lines 31.

Specifically, a plurality of compensation patterns 93 with conductive properties are arranged in the array substrate, and each compensation pattern 93 is coupled to the second sub-function electrode portion 111 corresponding to each non-target sub-pixel in the corresponding non-target sub-pixel column, the resistance of the common electrode 20 can be further reduced, and the loss generated by the common electrode 20 can be reduced.

In addition, the orthographic projection of each compensation pattern 93 on the substrate 60 is set to partially overlap the orthographic projection of the opening area of the corresponding non-target sub-pixel on the substrate 60, and each compensation pattern 93 has the same extension direction as the touch signal line 31, so that the touch signal line 31 and the compensation pattern 93 are evenly distributed on the entire array substrate. When the array substrate with this structure is applied to the display panel, it is more beneficial to improve the display uniformity of the display panel.

In addition, the compensation pattern 93 and the touch signal line 31 can be arranged at the same layer and made of the same material, so that the compensation pattern 93 and the touch signal line 31 can be formed in the same patterning process, so as to avoid to add additional patterning process for forming the compensation pattern 93, and effectively simplify the manufacturing process of the array substrate and save the production cost.

When using the array substrate provided in the above embodiment to form a liquid crystal display panel, the following processes are generally included.

First, the array substrate and the opposite substrate are formed. The array substrate is formed with a driving circuit layer, a common electrode 20 layer, a pixel electrode 40 layer and a first alignment film. The driving circuit layer includes driving circuit corresponding to the sub-pixels included in the liquid crystal display panel in a one-to-one manner, and the signal lines used to provide various signals for the driving circuit, these signal lines include a plurality of gate lines 10 and a plurality of data lines 30, and the gate lines 10 and the data lines 30 are crossed to define a plurality of sub-pixels; the pixel electrode 40 layer includes pixel electrodes 40 corresponding to the sub-pixels in a one-to-one manner, and each pixel electrode 40 is electrically connected to the output electrode 33 of the driving transistor in the corresponding driving circuit; the first alignment film covers the driving circuit layer, the common electrode 20 layer and the pixel electrode 40 layer, the first alignment film is aligned with a rubbing cloth to form a first alignment layer with grooves in a fixed direction; the opposite substrate is provided with color resistance units corresponding to the sub-pixels, the black matrix pattern around each color resist unit and the second alignment film covering the color resist unit and the black matrix pattern, the second alignment film is aligned with a rubbing cloth to form a second alignment layer with grooves in a fixed direction.

After the first alignment layer and the second alignment layer are formed, the array substrate and the opposite substrate are arranged oppositely to form a cell, the first alignment layer and the second alignment layer are both located in the cell, the color resistance unit is directly opposite to the opening area of the corresponding sub-pixel in a direction that is perpendicular to the base 60 of the array substrate, and the black matrix pattern can block the non-opening area around each sub-pixel.

Finally, liquid crystal molecules are injected into the liquid crystal cell formed by the array substrate and the opposite substrate, and the liquid crystal molecules can be arranged in an order according to the direction of the grooves in the first alignment layer and the second alignment layer.

In order to improve the transmittance of the liquid crystal display panel, in the present disclosure, when the liquid crystal display panel is formed, the liquid crystal display panel will adopt different display modes. The commonly used display modes includes the Advanced Super Dimension Switch (ADS) display mode, in an example, in the ADS display mode, each pixel electrode 40 included in the liquid crystal display panel is designed with a slit, and the extension direction of the slit is set to be perpendicular to the extension direction of the data line 30.

In the above-mentioned ADS display mode, in order to ensure the normal display function of the liquid crystal display panel, it is necessary to set the extension direction of the groove in the alignment layer to be the same as the extension direction of the slit. The alignment film is rubbed in the direction perpendicular to the extension direction of the data line 30, so that when the rubbing cloth is rubbed near the data line 30, it needs to climb a slope at the data line 30, which easily leads to a large rubbing shadow area near the data line 30. Because this area is prone to light leakage, this area needs to be blocked by the black matrix pattern on the opposite substrate after the cell is formed, which leads to an increase in the width of the black matrix pattern in the direction perpendicular to the extension direction of the data line 30 and decreases the aperture ratio of the liquid crystal display panel.

Based on the existence of the above problems, in the present disclosure, the extension direction of the slit is changed so that the extension direction of the slit is the same as the extension direction of the data line 30, and the direction of the groove after the alignment layer is aligned is the same as the extension direction of the data lines 30, so that during the alignment process, it is possible to avoid the formation of the rubbing shadow area near the data lines 30, thereby reducing the width of the black matrix pattern used to block the data lines 30 in the direction perpendicular to the extension direction of the data lines 30, effectively improving the aperture ratio of the liquid crystal display panel.

Figure 13:
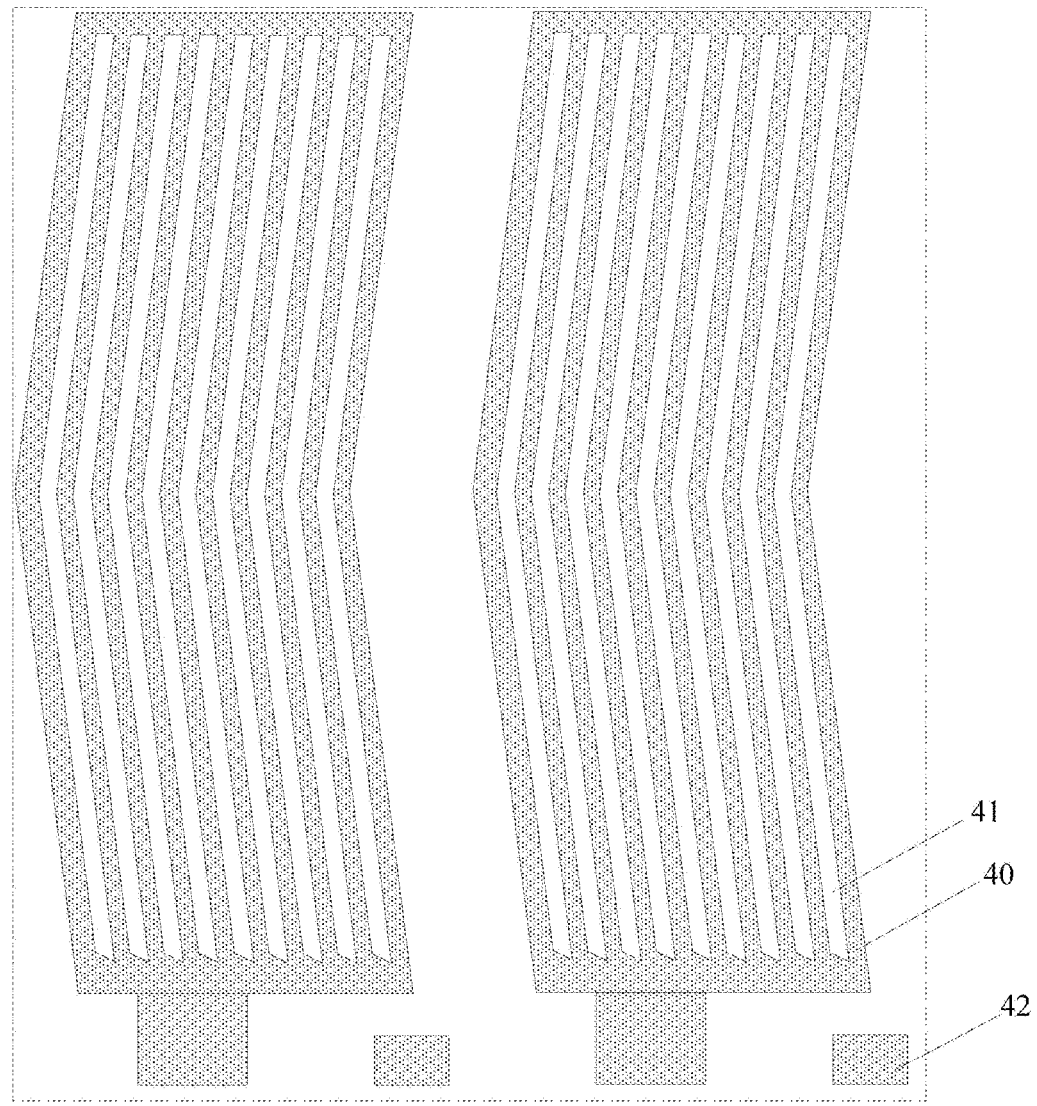
FIG. 13 is the schematic diagram of the layout of the 2ITO layer in FIG. 9.

As shown in FIGS. 1 and 13, in some embodiments, the pixel electrode 40 has a plurality of slits 41, and at least part of the slits 41 extend along the first direction.

Exemplarily, each sub-pixel includes a pixel electrode 40, and the pixel electrode 40 can be specifically made of indium tin oxide material, and during the manufacturing process, a plurality of slits 41 can be formed through a patterning process, and the extension direction of the slits 41 is the same as the extension direction of the data line 30, and a vertical ADS (i.e., H-ADS) design is realized. Each pixel electrode 40 is electrically connected to the output electrode 33 of the driving transistor in the corresponding sub-pixel driving circuit, and receives the driving signal provided by the driving transistor.

The process of forming the alignment layer on the array substrate includes:

First, an alignment material film is formed on a side of the array substrate where the pixel electrodes 40 are arranged, and then a rubbing cloth is used to rub and align along the extension direction of the slits 41 in the pixel electrodes 40 (i.e., the extension direction of the data lines 30) to form the alignment layer with grooves, the extension direction of the groove is the same as the extension direction of the slit 41.

Figure 17:
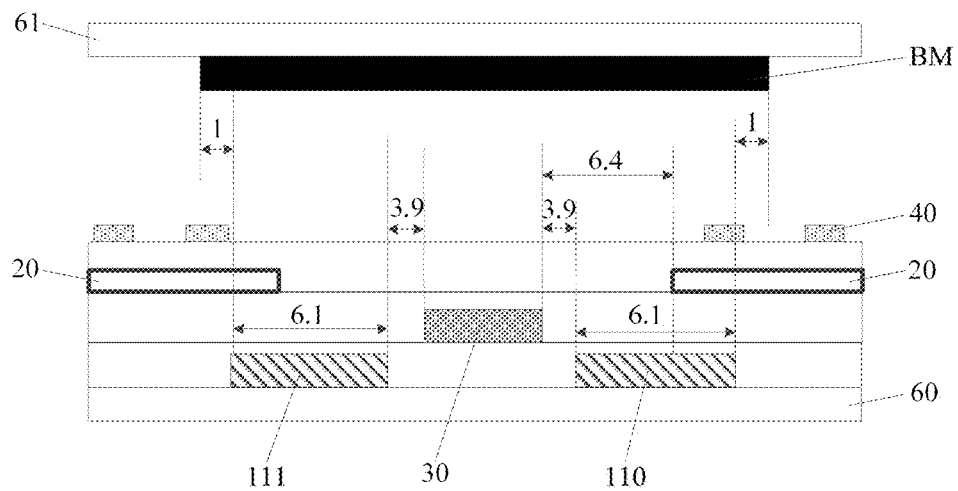
FIG. 17 is a schematic diagram of the positional relationship among the black matrix, the first sub-function electrode portion and the second sub-function electrode portion according to an embodiment of the present disclosure.
Figure 18:
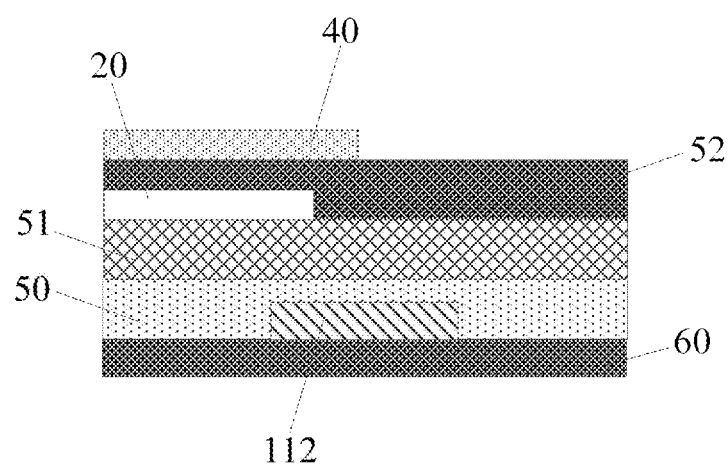
FIG. 18 is a schematic cross-sectional diagram along the E1E2 direction in FIG. 1.

According to the specific structure of the above array substrate, in the array substrate provided by the embodiment of the present disclosure, the extension direction of the slit 41 in each pixel electrode 40 is set to be the same as the extension direction of the data line 30, so that a large Rubbing Shadow area will not be formed near the data line 30 during the alignment process of the alignment material film on the array substrate. As shown in FIG. 17, when the array substrate and the opposite substrate 61 provided in the above embodiments are arranged oppositely to form a liquid crystal display panel, thereby reducing the width of the black matrix pattern BM in the opposite substrate for shielding the data lines 30 in the direction in parallel to the substrate 60 and perpendicular to the data line 30, and effectively improving the aperture ratio of the liquid crystal display panel.

Exemplarily, when aligning the alignment material film on the array substrate, an angle formed between the alignment direction and the extension direction of the slit 41 is between 7° and 11°, which may include 7° and 11°.

As shown in FIG. 17, exemplarily, the minimum distance between the orthographic projection of the data line 30 on the substrate 60 and the orthographic projection of the adjacent first sub-function electrode portion 110 on the substrate 60 is between 3.7 μm and 4.1 μm, which may be specially 3.9 μm. The minimum distance between the orthographic projection of the data line 30 on the substrate 60 and the orthographic projection of the adjacent second sub-function electrode portion 111 on the substrate 60 is between 3.7 μm and 4.1 μm, which may be specially 3.9 μm. In the direction parallel to the substrate 60, the width of the first sub-function electrode portion 110 in the direction perpendicular to the extension direction thereof is between 5.9 μm and 6.3 μm, which may specially 6.1 μm, the width of the second sub-function electrode portion 111 in the direction perpendicular to the extension direction thereof is between 5.9 μm and 6.3 μm, and can be specifically 6.1 μm. The minimum distance between the orthographic projection of the data line 30 on the substrate 60 and the orthographic projection of the adjacent common electrode 20 on the substrate 60 is between 6.2 μm and 6.6 μm, and may be specifically 6.4 µm. It is worth noting that the above-mentioned numerical ranges can include the end values.

Exemplarily, the orthographic projection of the black matrix pattern BM on the substrate 60 covers the orthographic projection of the first sub-function electrode portion 110 on the substrate 60; the orthographic projection of the black matrix pattern BM on the substrate 60 covers the orthographic projection of the second sub-function electrode portion 111 on substrate 60.

Exemplarily, the boundary of the orthographic projection of the black matrix pattern BM on the substrate 60 at least partially overlaps the boundary of the orthographic projection of the first sub-function electrode portion 110 covered by the black matrix pattern BM on the substrate 60; the boundary of the orthographic projection of the black matrix pattern BM on the substrate 60 at least partially overlaps the boundary of the orthographic projection of the second sub-function electrode portion 111 covered by the black matrix patter BM on the substrate 60.

Exemplarily, in a direction parallel to the substrate 60 and perpendicular to the extension direction of the first sub-function electrode portion 110, the boundary of the orthographic projection of the black matrix pattern BM on the substrate 60 exceeds the boundary of the orthographic projection of the first sub-function electrode portion 110 on the substrate 60 by 0.8 microns to 1.2 microns, which includes the end values. Exemplarily, as shown in FIG. 17, the value is 1 micron.

Exemplarily, in a direction parallel to the substrate 60 and perpendicular to the extension direction of the second sub-function electrode portion 111, the boundary of the orthographic projection of the black matrix pattern BM on the substrate 60 exceeds the boundary of the orthographic projection of the second sub-function electrode portion 111 on the substrate 60 by 0.8 microns to 1.2 microns, which includes the end values. Exemplarily, as shown in FIG. 17, the value is 1 micron.

In addition, the unit of the number marking the distance in FIG. 17 is micrometer.

In more detail, when the data line 30 generates a Rubbing Shadow area, and when the touch signal line 31 and the corresponding data line 30 are arranged side by side in the non-opening area, a width of an area to be shielded at the data line 30 along a direction perpendicular to the extension direction of the data line 30 can reach about 8.5 um, resulting in a loss of about 3% of the aperture ratio. Therefore, in the array substrate provided by the above embodiment, the extension direction of the slit 41 in the pixel electrode 40 is the same as the extension direction of the data line 30, and the touch signal line 31 is overlapped with the opening area, which avoids generating the Rubbing Shadow area, and the need for cell accuracy and short-circuit conditions considered from the touch signal line 31, thereby reducing the width of the area that needs to be shielded at the data line 30 in the direction perpendicular to the extension direction of the data line 30. When the liquid crystal display panel is formed, the pixel aperture ratio of the liquid crystal display panel can be increased by about 3%.

In some embodiments, the touch signal lines 31 and the data lines 30 extend in the same direction.

Specifically, the extension direction of the touch signal line 31 can be set according to actual needs. Exemplarily, the extension direction of the touch signal line 31 and the data line 30 can be set to be the same, that is, the extension direction of the touch signal line 31 is same as the extension direction of the slit 41 in the pixel electrode 40, so that when the alignment layer is formed on the array substrate, the rubbing direction of the rubbing cloth is the same as the extension direction of the touch signal line 31, so as to avoid generating a larger Rubbing Shadow area at the proximity of the touch signal line 31, ensure the display quality of the liquid crystal display panel when the array substrate is applied to the liquid crystal display panel.

In some embodiments, the orthographic projection of the touch signal line 31 on the substrate 60 partially overlaps the orthographic projection of the slit 41 included in each pixel electrode 40 in the corresponding target sub-pixel column on the substrate 60.

With the above layout, the touch signal line 31 can overlap the slit 41 as much as possible, thereby reducing the capacitance generated between the touch signal line 31 and the pixel electrode 40.

In some embodiments, the width of the touch signal line 31 in the direction perpendicular to the extension direction thereof can be set to be 4 µm-8 µm.

In some embodiments, the width of the slit 41 in the direction perpendicular to the extension direction thereof can be set to be 2 µm-4 µm.

The touch signal line 31 and the slit 41 are set to the above-mentioned sizes, which not only ensures the signal transmission performance of the touch signal line 31, but also makes the overlapping area between the touch signal line 31 and the slit 41 in the direction perpendicular to the substrate 60 not to be too large, so that when the array substrate is applied to the display panel, the display panel has good display quality.

In some embodiments, there is a third overlapping area between the orthographic projection of the touch signal line 31 on the substrate 60 and the orthographic projection of the opening area of each sub-pixel in the corresponding target sub-pixel column on the substrate 60, and a ratio of an area of the third overlapping area to an area of the opening area of the sub-pixel is 4% to 8%.

Specifically, the ratio of the area of the third overlapping area to the area of the opening area of the sub-pixels is set at 4% to 8%, so that the touch signal lines 31 will not block the opening area too much, when the array substrate is applied to a display panel, the display panel has good display quality.

In some embodiments, the touch electrode layer and the pixel electrode 40 are stacked and arranged between the substrate 60 and the pixel electrode 40.

Since in the array substrate provided by the above embodiment, the touch electrode layer is arranged between the substrate 60 and the pixel electrode 40, after the array substrate and the opposite substrate are arranged oppositely to form a liquid crystal display panel, the touch electrode layer is located inside the liquid crystal display panel, so that the touch electrode layer used to realize the touch function is integrated inside the liquid crystal display panel, and the liquid crystal touch display panel in the Full In Cell Touch structure is realized. The LCD touch display panel in the Full In Cell Touch structure integrates touch function and display function, which not only can realize one-stop seamless production, but also has the advantages of integration, lightness, low cost, low power consumption and high image quality, Multi-Touch and so on.

In some embodiments, the orthographic projection of each function electrode (including the first sub-function electrode portion 110, the second sub-function electrode portion 111 and the third sub-function electrode portion 112) on the substrate 60 of the array substrate at least partially overlap the orthographic projections of the non-opening area of the sub-pixel on the substrate 60.

In the array substrate provided by the above-mentioned embodiment, the orthographic projection of the function electrode with light-shielding function on the substrate 60 of the array substrate at least partially overlaps the orthographic projection of the non-opening area of the corresponding sub-pixel on the substrate 60, so that in the direction perpendicular to the substrate 60, the function electrodes can block the non-opening area of the corresponding sub-pixel, so that when the array substrate provided in the above embodiment and the opposite substrate are oppositely arranged to form a cell, the black matrix pattern on the opposite substrate only needs to block an area in the non-opening area corresponding to each sub-pixel that is not blocked by the function electrode, abnormal light leakage in the non-opening area is avoided and the display effect of the liquid crystal display panel is ensured. Therefore, when the array substrate and the opposite substrate are oppositely arranged to form a liquid crystal display panel, it can not only effectively reduce the size of the black matrix to be set in the opposite substrate, and save the manufacturing cost of the opposite substrate; but also effectively increase the aperture rate of the liquid crystal display panel.

As shown in FIG. 1, in some embodiments, the orthographic projection of the first sub-function electrode portion 110 on the substrate 60, the orthographic projection of the second sub-function electrode portion 111 on the substrate 60, and the orthographic projection of the third sub-function electrode portion 112 on the substrate 60 are all located at the periphery of the orthographic projection of the pixel electrode 40 in the corresponding sub-pixel on the substrate 60.

Specifically, the above arrangement enables the first sub-function electrode portion 110, the second sub-function electrode portion 111, and the third sub-function electrode portion 112 not only to realize the light-shielding function of the non-opening area corresponding to the sub-pixel, but also not to block the opening area corresponding to the sub-pixel, which is more conducive to improving the aperture ratio.

As shown in FIG. 9, in some embodiments, the plurality of sub-pixels includes a plurality of sub-pixel rows, and each sub-pixel row includes a plurality of sub-pixels arranged along the second direction;

The gate lines 10 are in one-to-one correspondence with the sub-pixel rows;

The orthographic projection of the first sub-function electrode portion 110 on the substrate 60, the orthographic projection of the second sub-function electrode portion 111 on the substrate 60, the orthographic projection of the third sub-function electrode portion 112 on the substrate 60, and the orthographic projection of the corresponding gate line 10 on the substrate 60 together surrounds the opening area of the corresponding sub-pixel.

Specifically, the plurality of sub-pixels can be arranged in an array, that is, including a plurality of sub-pixel rows and a plurality of sub-pixel columns, wherein each sub-pixel row includes a plurality of sub-pixels arranged along the extension direction of the gate line 10, and each sub-pixel column includes a plurality of sub-pixels arranged along the extension direction of the data line 30. The gate lines 10 are in one-to-one correspondence with the sub-pixel rows, and the gate lines 10 are respectively coupled to the driving circuits included in the sub-pixels in the corresponding sub-pixel row, and are used to provide scanning signals for the driving circuits included in the sub-pixels; the data lines 30 are in one-to-one correspondence with the sub-pixel columns, and the data lines 30 are respectively coupled to the sub-pixel driving circuits included in the sub-pixels in the corresponding sub-pixel column, and are used to provide data signals for the sub-pixel driving circuits included in the sub-pixels.

When the function electrodes are set in the above structure, the non-opening areas corresponding to the sub-pixels can be blocked in a large area by the function electrodes, which is more conducive to reducing the size of the corresponding black matrix pattern in the opposite substrate.

As shown in FIG. 10, in some embodiments, the first sub-function electrode portion 110, the second sub-function electrode portion 111, and the third sub-function electrode portion 112 are arranged at the same layer and made of the same material as the gate line 10.

Specifically, since the gate lines 10 and the data lines 30 are located on different layers of the array substrate, and are insulated from each other, the first sub-function electrode portion 110, the second sub-function electrode portion 111, and the third sub-function electrode portion 112 are arranged in the same layer as the gate line 10 to avoid short circuit between the function electrode and the data line 30. In addition, the first sub-function electrode portion 110, the second sub-function electrode portion 111, and the third sub-function electrode portion 112 are all arranged at the same layer and made of the same material as the gate line 10, which also enables the function electrode and the gate line 10 to be formed in the same patterning process, so as to avoid adding an additional process specially used for forming the function electrode, simplify the manufacturing process of the array substrate and reduce the manufacturing cost.

In some embodiments, the orthographic projection of the first sub-function electrode portion 110 on the substrate 60 partially overlaps the orthographic projection of the data line 30 located on a first side of the opening area of the corresponding sub-pixel on the substrate 60; and/or, the orthographic projection of the second sub-function electrode portion 111 on the substrate 60 partially overlaps the orthographic projection of the data line 30 located on a second side of the opening area of the corresponding sub-pixel on the substrate 60.

Specifically, since the data lines 30 are located in the non-opening area, when the function electrodes are used to shield the non-opening area from light, the orthographic projection of each data line 30 on the substrate 60 can be set to partially overlap the orthographic projection of the first sub-function electrode portion 110 and/or the second sub-function electrode portion 111 on the substrate 60, so that the first sub-function electrode portion 110 and/or the second sub-function electrode portion 111 can partially block the data lines 30, so as to further reduce the size of the black matrix pattern arranged on the opposite substrate.

In more detail, when the data line 30 is provided with the first sub-function electrode portion 110 and the second sub-function electrode portion 111 on both sides perpendicular to the extension direction thereof, the orthographic projection of the data line 30 on the substrate 60 partially overlaps each of the orthographic projection of the first sub-function electrode portion 110 on the substrate 60 and the orthographic projection of the second sub-function electrode portion 111 on the substrate 60; the orthographic projection of the data line 30 on the substrate 60 partially overlaps the orthographic projection of the first sub-function electrode portion 110 or the second sub-function electrode portion 111 on the substrate 60.

It should be noted that when the orthographic projection of the data line 30 on the substrate 60 is set to partially overlap each of the orthographic projection of the first sub-function electrode portion 110 on the substrate and the orthographic projection of the second sub-function electrode portion 111 on the substrate 60, the first sub-function electrode portion 110 and the second sub-function electrode portion 111 on both sides can be connected together or insulated from each other according to actual needs.

In some embodiments, the orthographic projection of the first sub-function electrode portion 110 on the substrate 60 is located between the orthographic projection of the opening area of the corresponding sub-pixel on the substrate 60 and the orthographic projection of the data line 30 on the first side of the opening area of the sub-pixel on the substrate 60; and/or, The orthographic projection of the second sub-function electrode portion 111 on the substrate 60 is located between the orthographic projection of the opening area of the corresponding sub-pixel on the substrate 60 and the orthographic projection of the data line 30 located on the second side of the opening area of the sub-pixel on the substrate 60.

Specifically, in the above arrangement, the orthographic projection of each data line 30 on the substrate 60 does not overlap the orthographic projection of all function electrodes (the first sub-function electrode portion 110, the second sub-function electrode portion 111, and the third sub-function electrode portion 112) on the substrate 60, so that in the extension direction perpendicular to the data line 30, there is a preset distance between the first sub-function electrode portion 110 and the second sub-function electrode portion 111 on both sides of the data line 30, and the preset distance is greater than or equal to the width of the data line 30 in a direction perpendicular to the extension direction thereof.

It should be noted that when the orthographic projection of each data line 30 on the substrate 60 is set to not overlap the orthographic projections of all function electrodes on the substrate 60, after the array substrate and the opposite substrate are arranged oppositely to form a cell, the data lines 30 are shielded by the black matrix pattern on the opposite substrate.

In the array substrate provided by the above embodiment, the orthographic projection of each data line 30 on the substrate 60 is set to not to overlap the orthographic projections of all function electrodes on the substrate 60, which is more conducive to the stable transmission of the data signal on the data line 30, so as to better ensure the stable working performance of the array substrate.

As shown in FIG. 1 and FIG. 20, in some embodiments, there is an overlapping area between the orthographic projection of the touch signal line 31 on the substrate 60 and the orthographic projection of the opening area of one sub-pixel on the substrate 60, and a ratio d of the overlapping area to the area of the orthographic projection of the opening area of the sub-pixel on the substrate 60 satisfies: 4%≤d≤10%.

Exemplarily, the ratio d of the overlapping area to the area of the orthographic projection of the opening area of the sub-pixel on the substrate 60 includes 6.5%.

The above arrangement is beneficial to improve the pixel aperture ratio of the display panel formed by the array substrate.

As shown in FIG. 1 and FIG. 20, in some embodiments, the distance L1 between the orthographic projection of the first connection hole Via1 on the substrate 60 and the orthographic projection of the touch signal line 31 on the substrate 60 satisfies: 5 μm≤L1≤90 μm.

The distance L2 between the orthographic projection of the touch signal line 31 on the substrate 60 and the orthographic projection of the data line 30 close to the second sub-function electrode portion 111 on the substrate 60 satisfies: 8 μm≤L2≤30 μm.

The distance L3 between the orthographic projection of the first connection hole Via1 on the substrate 60 and the orthographic projection of the data line 31 close to the first sub-function electrode portion 110 on the substrate 60 satisfies: 5 μm≤L3≤30 μm.

Exemplarily, the distance L1 between the orthographic projection of the first connection hole Via1 on the substrate 60 and the orthographic projection of the touch signal line 31 on the substrate 60 is 24.3 μm.

Exemplarily, the distance L2 between the orthographic projection of the touch signal line 31 on the substrate 60 and the orthographic projection of the data line 30 close to the second sub-function electrode portion 111 on the substrate 60 is 20 μm.

Exemplarily, the distance L3 between the orthographic projection of the first connection hole Via1 on the substrate 60 and the orthographic projection of the data line 30 close to the first sub-function electrode portion 110 on the substrate 60 is 9.6 μm.

The values of L1, L2 and L3 according to the above ranges can well ensure that the data line 30, the touch signal line 3131 and the first connection hole Via1 will not be short-circuited.

In some embodiments, the width L4 of the touch signal line 31 in a direction perpendicular to the extension direction thereof is set to satisfy: 3.5 μm≤L4≤6 μm.

Exemplarily, the width L4 of the touch signal line 31 in the direction perpendicular to the extension direction thereof is 4 μm.

Exemplarily, in the extension direction of the touch signal line 31, a length of a portion of the orthographic projection of the touch signal line 31 on the substrate 60 that overlaps the orthographic projection of one sub-pixel on the substrate 60 is between 100 μm and 500 μm, the endpoint values can be taken. Exemplarily, in the extension direction of the touch signal line 31, the length of the portion of the orthographic projection of the touch signal line 31 on the substrate 60 that overlaps the orthographic projection of one sub-pixel on the substrate 60 includes 207.1 μm.

The above arrangement is beneficial to improve the pixel aperture ratio of the display panel formed by the array substrate.

As shown in FIG. 1 and FIG. 20, in some embodiments, a distance between the orthographic projection of the third connection hole Via3 on the substrate 60 and the orthographic projection of a common electrode 20 in a corresponding sub-pixel on the substrate 60 is less than a distance between the orthographic projection of the fifth connection hole Via5 on the substrate 60 and the orthographic projection of the common electrode 20 on the substrate 60.

As shown in FIG. 1 and FIG. 20, in some embodiments, an area of the non-overlapping area between the orthographic projection of the fourth connection hole Via4 on the substrate 60 and the orthographic projection of the touch signal line 31 on the substrate 60 is greater than or equal to one third of the area of the orthographic projection of the fourth connection hole Via4 on the substrate 60;

The portion of the orthographic projection of the fourth connection hole Via4 on the substrate 60 that does not overlap the orthographic projection of the touch signal line 31 on the substrate 60 is located in a side of the orthographic projection of the touch signal line 31 on the substrate 60 away from the orthographic projection of the second connection hole Via2 on the substrate 60.

As shown in FIG. 1 and FIG. 20, in some embodiments, the orthographic projection of the first connection hole Via1 on the substrate 60 and the orthographic projection of the second connection hole Via2 on the substrate 60 are both located on the same side of the orthographic projection of the touch signal line 31 on the substrate 60.

As shown in FIG. 1 and FIG. 20, in some embodiments, in the same sub-pixel column, the distance between the orthographic projection of the second connection hole Via2 on the substrate 60 and the orthographic projection of the corresponding data line 30 (exemplarily, the corresponding data line is coupled to the second connection hole Via2) on the substrate 60 is smaller than the distance between the orthographic projection of the first connection hole Via1 (exemplarily, the first connection hole Via1 and the second connection hole Via2 are adjacent to each other and arranged on two sides of the same gate line, respectively) on the substrate and the orthographic projection of the data line 30 on the substrate 60.

The layout of the array substrate in the above manner is beneficial to improve the working stability of the array substrate and reduce the difficulty of layout of the array substrate in the layout space.

Embodiments of the present disclosure further provide a display device including the array substrate provided by the above embodiments.

It should be noted that the display device may be any product or component with a display function, such as a TV, a monitor, a digital photo frame, a mobile phone, and a tablet computer.

In the array substrate provided by the above-mentioned embodiment, the orthographic projection of the pixel electrode 40 on the substrate 60 at least partially overlaps the orthographic projection of the opening area of the sub-pixel on the substrate 60, the orthographic projection of the common electrode 20 on the substrate 60 at least partially overlaps the orthographic projection of the opening area of the sub-pixel on the substrate 60, and the orthographic projection of the touch signal line 31 on the substrate 60 partially overlaps the orthographic projection of the opening area of the sub-pixel on the substrate 60. The touch signal line 31, the common electrode 20 and the pixel electrode 40 are stacked in sequence in a direction away from the substrate 60; so that in the opening area of the sub-pixel, the common electrode 20 is located between the touch signal line 31 and the pixel electrode 40, and the common electrode 20 can play a shielding role between the touch signal line 31 and the pixel electrode 40, which can shield the opening area transmittance deviation caused by the asymmetry of the left and right electric fields formed between the touch signal line 31 and the pixel electrode 40 caused by the process fluctuation of the pixel electrode 40, so as to solve the visual difference of brightness caused by the transmittance deviation and visually formed black stains or white stains, and effectively improve the yield of the product.

Therefore, the display device provided by the embodiment of the present disclosure also has the above-mentioned beneficial effects when including the above-mentioned array substrate, which is not repeated here.

Embodiments of the present disclosure also provide a method of manufacturing an array substrate, the method includes:

Forming a sub-pixel and a touch signal line 31 on a substrate 60;

Wherein the sub-pixel includes a pixel electrode 40 and a common electrode 20. An orthographic projection of the pixel electrode 40 on the substrate 60 at least partially overlaps an orthographic projection of an opening area of the sub-pixel on the substrate 60, and an orthographic projection of the common electrode 20 on the substrate 60 at least partially overlaps the orthographic projection of the opening area of the sub-pixel on the substrate 60;

An orthographic projection of the touch signal line 31 on the substrate 60 partially overlaps the orthographic projection of the opening area of the sub-pixel on the substrate 60; the touch signal line 31, the common electrode 20 and the pixel electrode 40 are stacked in sequence along a direction away from the substrate 60.

In the array substrate manufactured by the method provided by the embodiment of the present disclosure, the orthographic projection of the pixel electrode 40 on the substrate 60 at least partially overlaps the orthographic projection of the opening area of the sub-pixel on the substrate 60, the orthographic projection of the common electrode 20 on the substrate 60 at least partially overlaps the orthographic projection of the opening area of the sub-pixel on the substrate 60, and the orthographic projection of the touch signal line 31 on the substrate 60 partially overlaps the orthographic projection of the opening area of the sub-pixel on the substrate 60. The touch signal line 31, the common electrode 20 and the pixel electrode 40 are stacked in sequence in a direction away from the substrate 60; so that in the opening area of the sub-pixel, the common electrode 20 is located between the touch signal line 31 and the pixel electrode 40, and the common electrode 20 can play a shielding role between the touch signal line 31 and the pixel electrode 40, which can shield the opening area transmittance deviation caused by the asymmetry of the left and right electric fields formed between the touch signal line 31 and the pixel electrode 40 caused by the process fluctuation of the pixel electrode 40, so as to solve the visual difference of brightness caused by the transmittance deviation and visually formed black stains or white stains, and effectively improve the yield of the product.

In some embodiments, the method further includes:

Forming a gate line 10, a first sub-function electrode portion 110, a second sub-function electrode portion 111 and a second sub-function electrode portion 111 on the substrate 60; wherein at least part of the first sub-function electrode portion 110 and at least part of the second sub-function electrode portion 111 extend along a first direction, the first sub-function electrode portion 110 is located on a first side of the opening area of the sub-pixel, the second sub-function electrode portion 111 is located on a second side of the opening area of the sub-pixel, the first side and the second side are opposite along a second direction, the second direction intersects the first direction; at least part of the third sub-function electrode portion 112 extends along the second direction, the third sub-function electrode portion 112 and the first sub-function electrode portion 110;

forming a first insulating layer 50, the first insulating layer 50 covering the gate line 10, the first sub-function electrode portion 110, the second sub-function electrode portion 111 and the second sub-function electrode portion 111;

forming an output electrode 33 of the driving circuit, the data line 30 and the touch signal line 31 on a side of the first insulating layer 50 away from the substrate 60;

forming an organic insulating layer 51, and the organic insulating layer 51 covering the output electrode 33 of the driving circuit, the data line 30 and the touch signal line 31;

forming a first connection hole Via1, a second connection hole Via2 and a fourth connection hole Via4 in one patterning process; the first connection hole Via1, the second connection hole Via2 and the fourth connection hole Via4 all penetrating the organic insulating layer 51 and the first insulating layer 50;

the first connection hole Via1 exposing at least part of the third sub-function electrode portion; the second connection hole Via2 exposing at least part of the corresponding output electrode 33, and an orthographic projection of a boundary of the second connection hole Via2 on the substrate 60 at least partially overlapping the orthographic projections of the corresponding output electrode 33 on the substrate 60; the fourth connection hole Via4 exposing at least part of the corresponding touch signal line 31 and at least part of the second sub-function electrode portion 111, and an orthographic projection of a boundary of the fourth connection hole Via4 on the substrate 60 at least partially overlapping the orthographic projection of the corresponding touch signal line 31 on the substrate 60;

forming a common electrode 20, the common electrode 20 being coupled to the corresponding third sub-function electrode portion through the first connection hole Via1;

forming a passivation layer 52, the passivation layer 52 covering the common electrode 20;

patterning the passivation layer 52 to form a third connection hole Via3 and a fifth connection hole Via5; the third connection hole Via3 and the fifth connection hole Via5 both penetrating the passivation layer 52; the third connection hole Via3 exposing at least part of the corresponding output electrode 33, the orthographic projection of the second connection hole Via2 on the substrate 60 surrounding the orthographic projection of the third connection hole Via3 on the substrate 60; the fifth connection hole Via5 exposing at least part of the corresponding touch signal line 31 and at least part of the second sub-function electrode portion 111, the orthographic projection of the fourth connection hole Via4 on the substrate 60 surrounding the orthographic projection of the fifth connection hole Via5 on the substrate 60;

forming a pixel electrode 40 and a connection pattern 42, wherein the pixel electrode 40 is coupled to the output electrode 33 through the second connection hole Via2 and the third connection hole Via3, and the connection pattern 42 is coupled to the corresponding touch signal line 31 through the fourth connection hole Via4 and the fifth connection hole Via5; the connection pattern 42 is also coupled to the corresponding second sub-function electrode portion 111 through the fourth connection hole Via4 and the fifth connection hole Via5.

In more detail, a first gate metal layer is formed on the substrate 60, and the first gate metal layer includes a first molybdenum metal layer, a first aluminum metal layer and a second molybdenum metal layer that are stacked in sequence along a direction away from the substrate 60, the thickness of the first molybdenum metal layer is 150 Å, the thickness of the first aluminum metal layer is 3000 Å, and the thickness of the second molybdenum metal layer is 800 Å. The first gate metal layer is patterned, and the patterning process includes coating, exposure, development, wet etching and other processes, so as to form the gate line 10, the first sub-function electrode portion 110, the second sub-function electrode portion 111 and the third sub-function electrode portion 112.

A whole layer of the first insulating layer 50 is deposited, the first insulating layer 50 covers the gate line 10, the first sub-function electrode portion 110, the second sub-function electrode portion 111 and the second sub-function electrode portion 111; the material of the first insulating layer 50 include silicon nitride, the thickness of the first insulating layer 50 is 4000 Å.

The active layer 70 and the source-drain metal layer of the thin film transistor are manufactured through the SSM Mask process (i.e., the 4Mask process). The thickness of the active layer 70 is 1700 Å. The source-drain metal layer includes a third molybdenum metal layer, a second aluminum metal layer, and a fourth molybdenum metal layer, which are sequentially stacked along the direction away from the substrate 60. The thickness of the third molybdenum metal layer is 150 Å, and the thickness of the second aluminum metal layer is 3000 Å, and the thickness of the fourth molybdenum metal layer is 800 Å. The source-drain metal layer is patterned, the patterning process includes coating, exposure, development, wet etching and other processes, so as to form the input electrode 32 and the output electrode 33 of the driving circuit, the data line 30 and the touch signal line 31.

A buffer layer is formed by deposition of silicon nitride material, and the thickness of the buffer layer is 1000 Å. The organic resin is used to continue to deposit an entire organic insulating layer 51 on the side of the buffer layer away from the substrate 60, and the thickness of the organic insulating layer 51 is 20000 Å.

The organic insulating layer 51 is patterned to form openings penetrating the organic insulating layer 51 and the buffer layer, and the first insulating layer 50 is continuously etched in the openings, thereby forming the first connection hole Via1, the second connection hole Via2 and the fourth connection hole Via4 penetrating the organic insulating layer 51 and the first insulating layer 50.

A 1ITO layer is formed using indium tin oxide material, and the thickness of the 1ITO layer is 700 Å. A patterning process is performed on the 1ITO layer, the pattering process includes coating, exposure, development, wet etching and other processes to form a common electrode 20, the common electrode 20 is coupled to the corresponding third sub-function electrode portion through the first connection hole Via1.

The silicon nitride material is used to deposit to form an entire passivation layer 52. The thickness of the passivation layer 52 is 4000 Å. A patterning process is performed on the passivation layer 52, and the passivation layer 52 is patterned to form a third connection hole Via3 and a fifth connection hole Via5 penetrating the passivation layer 52.

A 2ITO layer was formed using the indium tin oxide material, and the thickness of the 2ITO layer is 700 Å. A patterning process is performed on the 2ITO layer. The patterning process includes coating, exposure, development, wet etching, and other process, to form a pixel electrode 40 and a connection pattern 42. The pixel electrode 40 is coupled to the output electrode 33 through the second connection hole Via2 and the third connection hole Via3, the connection pattern 42 is coupled to the corresponding touch signal line 31 through the fourth connection hole Via4 and the fifth connection hole Via5; the connection pattern 42 is also coupled to the corresponding second sub-function electrode portion 111 through the fourth connection hole Via4 and the fifth connection hole Via5.

It should be noted that the "same layer" in the embodiments of the present disclosure may refer to a film layer on the same structural layer. Or, for example, the film layers in the same layer may be a layer structure formed by using the same film forming process to form a film layer with a specific pattern, and then using the same mask to pattern the film layer through one patterning process. Depending on the specific pattern, one patterning process may include multiple exposure, development or etching processes, and the specific pattern in the formed layer structure may be continuous or discontinuous. These specific pattern may also be at different heights or have different thicknesses.

In the method embodiments of the present disclosure, the sequence numbers of the steps are not used to limit the sequence of the steps. For those of ordinary skill in the art, the sequence of the steps can be changed without creative work and fall within the scope of protection of the present disclosure.

It should be noted that the various embodiments in this specification are described in a progressive manner, and the same or similar portions among the various embodiments can be referred to each other, and each embodiment focuses on the differences from other embodiments. In particular, for the method embodiment, since it is basically similar to the product embodiment, the description is relatively simple, and the relevant portion can be referred to the description of the product embodiment.

Unless otherwise defined, the technical or scientific terms used in the present disclosure shall have the usual meanings understood by those with ordinary skills in the field to which this disclosure belongs. The "first", "second" and similar words used in the present disclosure do not indicate any order, quantity or importance, but are only used to distinguish different components. The word "include" or "comprise" and other similar words mean that the element or item appearing before the word encompasses the element or item listed after the word and its equivalents, but does not exclude other elements or items. Similar words such as "connected" or "coupled" are not limited to physical or mechanical connections, but may include electrical connections, whether direct or indirect. "Up", "Down", "Left", "Right", etc. are only used to indicate the relative position relationship. When the absolute position of the described object changes, the relative position relationship may also change accordingly.

It can be understood that when an element such as a layer, film, area, or substrate is referred to as being "on" or "under" another element, the element can be "directly" on or "under" the other element, or there may be intermediate elements therebetween.

In the description of the foregoing embodiments, specific features, structures, materials, or characteristics may be combined in any one or more embodiments or examples in an appropriate manner.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:
1. An array substrate, comprising:
a substrate;
a sub-pixel, wherein the sub-pixel is located on the substrate, and the sub-pixel includes a pixel electrode and a common electrode, an orthographic projection of the pixel electrode on the substrate at least partially overlaps an orthographic projection of an opening area of the sub-pixel on the substrate, and an orthographic projection of the common electrode on the substrate at least partially overlaps the orthographic projection of the opening area of the sub-pixel on the substrate;
a touch signal line, wherein the touch signal line is located on the substrate, and an orthographic projection of the touch signal line on the substrate partially overlaps the orthographic projection of the opening area of the sub-pixel on the substrate; the touch signal line, the common electrode and the pixel electrode are stacked in sequence along a direction away from the substrate;
an organic insulating layer, at least part of the organic insulating layer being located between the touch signal line and the common electrode; and
a function electrode, wherein the function electrode includes a first sub-function electrode portion and a second sub-function electrode portion, at least part of the first sub-function electrode portion and at least part of the second sub-function electrode portion are both extended along a first direction, the first sub-function electrode portion is located on a first side of the opening area of the sub-pixel, the second sub-function electrode portion is located on a second side of the opening area of the sub-pixel, and the first side and the second side are opposite along a second direction, the second direction intersects the first direction;
wherein the function electrode further includes a third sub-function electrode portion, at least part of the third sub-function electrode portion extends along the second direction, and the third sub-function electrode portion is respectively electrically connected to the first sub-function electrode portion and the common electrode;
wherein the array substrate further comprises:
a first insulating layer, wherein the third sub-function electrode portion, the first insulating layer, the organic insulating layer and the common electrode are stacked in sequence along the direction away from the substrate;
the common electrode is coupled to the third sub-function electrode portion through a first connection hole, and the first connection hole penetrates the organic insulating layer and the first insulating layer;
wherein the sub-pixel further comprises: a driving circuit, wherein at least part of an output electrode of the driving circuit is located between the first insulating layer and the organic insulating layer; the array substrate further includes a passivation layer, at least part of the passivation layer is located between the common electrode and the pixel electrode;
the pixel electrode is coupled to the output electrode through a second connection hole and a third connection hole, the second connection hole penetrates the organic insulating layer and the first insulating layer, the third connection hole penetrates the passivation layer, an orthographic projection of the second connection hole on the substrate surrounds an orthographic projection of the third connection hole on the substrate, an orthographic projection of a boundary of the second connection hole on the substrate at least partially overlaps an orthographic projection of the output electrode on the substrate.

2. The array substrate according to claim 1, wherein the touch signal line includes a first portion, and an orthographic projection of the first portion on the substrate overlaps the orthographic projection of the opening area of the sub-pixel on the substrate, the orthographic projection of the first portion of the touch signal line on the substrate at least partially overlaps the orthographic projection of the common electrode on the substrate.

3. The array substrate according to claim 2, wherein the orthographic projection of the first portion of the touch signal line on the substrate is completely covered by the orthographic projection of the common electrode on the substrate.

4. The array substrate according to claim 1, further comprising:
- a plurality of gate lines, a plurality of data lines and a plurality of sub-pixels; wherein the plurality of gate lines and the plurality of data lines cross to each other to form a plurality of sub-pixel areas, and a plurality of opening areas included in the plurality of sub-pixels are located in the plurality of sub-pixel areas in a one-to-one corresponding manner; the plurality of sub-pixels includes a plurality of sub-pixel columns, and each sub-pixel column includes a plurality of sub-pixels arranged along the first direction;
- a touch electrode layer arranged in a touch area of the array substrate, wherein the touch area includes a plurality of touch sub-areas, the touch electrode layer includes a plurality of touch electrode units, and the plurality of touch electrode units are located in the plurality of touch sub-areas in a one-to-one corresponding manner; and,
- a plurality of touch signal lines coupled to the plurality of touch electrode units in a one-to-one corresponding manner, wherein the touch signal lines correspond to target sub-pixel columns in the plurality of sub-pixel columns in a one-to-one manner, and an orthographic projection of the touch signal line on the substrate partially overlaps an orthographic projection of an opening area of each sub-pixel in a corresponding target sub-pixel column on the substrate.

5. The array substrate according to claim 4, wherein a plurality of common electrodes located in a same touch sub-area are coupled to each other, and the plurality of common electrodes are multiplexed as touch electrode units in the same touch sub-area.

6. The array substrate according to claim 5, further comprising: a plurality of function electrodes corresponding to the plurality of sub-pixels in a one-to-one manner, wherein a touch signal line is coupled to a second sub-function electrode portion corresponding to at least part of target sub-pixels included in a target sub-pixel column corresponding to the touch signal line, and target sub-pixels included in the target sub-pixel column corresponding to the touch signal line are located in a touch sub-area corresponding to the touch signal line.

7. The array substrate according to claim 6, wherein a target sub-pixel includes a connection pattern, the connection pattern and the pixel electrode are arranged at a same layer and made of a same material, and the connection pattern is respectively coupled to the second sub-function electrode portion corresponding to the target sub-pixel and a corresponding touch signal line.

8. The array substrate according to claim 7, wherein,
the connection pattern is coupled to the corresponding touch signal line through a fourth connection hole and a fifth connection hole, and the fourth connection hole penetrates the organic insulating layer and the first insulating layer, the fifth connection hole penetrates the passivation layer, an orthographic projection of the fourth connection hole on the substrate surrounds an orthographic projection of the fifth connection hole on the substrate, an orthographic projection of a boundary of the fourth connection hole on the substrate at least partially overlaps an orthographic projection of the corresponding touch signal line on the substrate;
wherein the connection pattern is coupled to a corresponding second sub-function electrode portion through the fourth connection hole and the fifth connection hole.

9. The array substrate according to claim 6, wherein the touch signal line is coupled to a second sub-function electrode portions corresponding to each sub-pixel in the target sub-pixel column corresponding to the touch signal line;
wherein the array substrate further comprises a first conductive connection portion and a second conductive connection portion,
wherein,
among function electrodes corresponding to each target sub-pixel, the third sub-function electrode portion is coupled to the second sub-function electrode portion through the first conductive connection portion;
among function electrodes corresponding to sub-pixels located in a same touch sub-area, third sub-function electrode portions adjacent in the second direction are coupled through the second conductive connection portion.

10. The array substrate according to claim 6, wherein,
the third sub-function electrode portion is electrically connected to the second sub-function electrode portion;
the array substrate further includes: a third conductive connection portion, the third conductive connection portion is coupled to two third sub-function electrode portions that are adjacent to each other along the second direction and located in the same touch sub-area.

11. The array substrate according to claim 4, wherein the pixel electrode has a plurality of slits, and at least part of the plurality of slits extend along the first direction;
wherein the orthographic projection of a touch signal line on the substrate partially overlaps an orthographic projection of a slit included in each pixel electrode in the corresponding target sub-pixel column on the substrate;
or;
an orthographic projection of the first sub-function electrode portion on the substrate, an orthographic projection of the second sub-function electrode portion on the substrate, and an orthographic projection of the third sub-function electrode portion on the substrate are all located at a periphery of the orthographic projection of the pixel electrode in a corresponding sub-pixel on the substrate.

12. The array substrate according to claim 4, wherein the plurality of sub-pixels includes a plurality of sub-pixel rows, and each sub-pixel row includes a plurality of sub-pixels arranged along the second direction;
the gate lines correspond to the plurality of sub-pixel rows in a one-to-one manner;

an orthographic projection of the first sub-function electrode portion on the substrate, an orthographic projection of the second sub-function electrode portion on the substrate, an orthographic projection of the third sub-function electrode portion on the substrate, and an orthographic projection of a corresponding gate line on the substrate together surrounds an opening area of a corresponding sub-pixel;

wherein the first sub-function electrode portion, the second sub-function electrode portion, and the third sub-function electrode portion are arranged at a same layer and made of a same material as a gate line.

13. The array substrate according to claim 6, wherein,
an orthographic projection of the first sub-function electrode portion on the substrate partially overlaps an orthographic projection of a data line located on a first side of an opening area of a corresponding sub-pixel on the substrate; and/or,
an orthographic projection of the second sub-function electrode portion on the substrate partially overlaps an orthographic projection of a data line located on a second side of the opening area of the corresponding sub-pixel on the substrate;
or;
wherein,
an orthographic projection of the first sub-function electrode portion on the substrate is located between the orthographic projection of the opening area of the corresponding sub-pixel on the substrate and an orthographic projection of a data line located on a first side of an opening area of the sub-pixel on the substrate; and/or,
an orthographic projection of the second sub-function electrode portion on the substrate is located between the orthographic projection of the opening area of the corresponding sub-pixel on the substrate and an orthographic projection of a data line located on a second side of the opening area of the sub-pixel on the substrate.

14. The array substrate according to claim 8, wherein a distance between the orthographic projection of the third connection hole on the substrate and an orthographic projection of a common electrode in a corresponding sub-pixel on the substrate is less than a distance between the orthographic projection of the fifth connection hole on the substrate and the orthographic projection of the common electrode on the substrate;
or;
wherein,
an area of a non-overlapping area between the orthographic projection of the fourth connection hole on the substrate and the orthographic projection of the touch signal line on the substrate is greater than or equal to one third of an area of the orthographic projection of the fourth connection hole on the substrate;
a part of the orthographic projection of the fourth connection hole on the substrate that does not overlap the orthographic projection of the touch signal line on the substrate is located in a side of the orthographic projection of the touch signal line on the substrate away from the orthographic projection of the second connection hole on the substrate.

15. The array substrate according to claim 1, wherein,
the orthographic projection of the first connection hole on the substrate and the orthographic projection of the second connection hole on the substrate are both located on a same side of the orthographic projection of the touch signal line on the substrate;
or;
wherein,
a distance between the orthographic projection of the second connection hole on the substrate and the orthographic projection of a corresponding data line on the substrate is smaller than a distance between the orthographic projection of the first connection hole on the substrate and the orthographic projection of the corresponding data line on the substrate.

16. A display device comprising an array substrate, wherein
the array substrate includes: a substrate; a sub-pixel and a touch signal line,
the sub-pixel is located on the substrate, and the sub-pixel includes a pixel electrode and a common electrode, an orthographic projection of the pixel electrode on the substrate at least partially overlaps an orthographic projection of an opening area of the sub-pixel on the substrate, and an orthographic projection of the common electrode on the substrate at least partially overlaps the orthographic projection of the opening area of the sub-pixel on the substrate; and
the touch signal line is located on the substrate, and an orthographic projection of the touch signal line on the substrate partially overlaps the orthographic projection of the opening area of the sub-pixel on the substrate; the touch signal line, the common electrode and the pixel electrode are stacked in sequence along a direction away from the substrate;
wherein the array substrate further comprises:
an organic insulating layer, at least part of the organic insulating layer being located between the touch signal line and the common electrode; and
a function electrode, wherein the function electrode includes a first sub-function electrode portion and a second sub-function electrode portion, at least part of the first sub-function electrode portion and at least part of the second sub-function electrode portion are both extended along a first direction, the first sub-function electrode portion is located on a first side of the opening area of the sub-pixel, the second sub-function electrode portion is located on a second side of the opening area of the sub-pixel, and the first side and the second side are opposite along a second direction, the second direction intersects the first direction;
wherein the function electrode further includes a third sub-function electrode portion, at least part of the third sub-function electrode portion extends along the second direction, and the third sub-function electrode portion is respectively electrically connected to the first sub-function electrode portion and the common electrode;
wherein the array substrate further comprises:
a first insulating layer, wherein the third sub-function electrode portion, the first insulating layer, the organic insulating layer and the common electrode are stacked in sequence along the direction away from the substrate;
the common electrode is coupled to the third sub-function electrode portion through a first connection hole, and the first connection hole penetrates the organic insulating layer and the first insulating layer;
wherein the sub-pixel further comprises: a driving circuit, wherein at least part of an output electrode of the driving circuit is located between the first insulating layer and the organic insulating layer; the array substrate further includes a passivation layer, at least part of the passivation layer is located between the common electrode and the pixel electrode;

the pixel electrode is coupled to the output electrode through a second connection hole and a third connection hole, the second connection hole penetrates the organic insulating layer and the first insulating layer, the third connection hole penetrates the passivation layer, an orthographic projection of the second connection hole on the substrate surrounds an orthographic projection of the third connection hole on the substrate, an orthographic projection of a boundary of the second connection hole on the substrate at least partially overlaps an orthographic projection of the output electrode on the substrate.

* * * * *